(12) United States Patent
Dairiki et al.

(10) Patent No.: US 7,972,910 B2
(45) Date of Patent: Jul. 5, 2011

(54) MANUFACTURING METHOD OF INTEGRATED CIRCUIT DEVICE INCLUDING THIN FILM TRANSISTOR

(75) Inventors: Koji Dairiki, Isehara (JP); Naoto Kusumoto, Isehara (JP); Takuya Tsurume, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 772 days.

(21) Appl. No.: 11/442,225

(22) Filed: May 30, 2006

(65) Prior Publication Data

US 2006/0273319 A1 Dec. 7, 2006

(30) Foreign Application Priority Data

Jun. 3, 2005 (JP) ................................. 2005-164605

(51) Int. Cl.
    *H01L 21/46* (2006.01)
(52) U.S. Cl. ................. 438/149; 438/459; 257/E29.241
(58) Field of Classification Search .................. 438/457, 438/149, 151, 157, 166
    See application file for complete search history.

(56) References Cited

U.S. PATENT DOCUMENTS

| | | | |
|---|---|---|---|
| 4,838,654 A | 6/1989 | Hamaguchi et al. | |
| 5,391,257 A | 2/1995 | Sullivan et al. | |
| 5,834,327 A | 11/1998 | Yamazaki et al. | |
| 6,100,166 A | 8/2000 | Sakaguchi et al. | |
| 6,127,199 A | 10/2000 | Inoue et al. | |
| 6,372,608 B1 | 4/2002 | Shimoda et al. | |
| 6,534,382 B1 | 3/2003 | Sakaguchi et al. | |
| 6,645,830 B2 | 11/2003 | Shimoda et al. | |
| 6,646,711 B2 | 11/2003 | Sugano | |
| RE38,466 E | 3/2004 | Inoue et al. | |
| 6,700,631 B1 | 3/2004 | Inoue et al. | |
| 6,818,530 B2 | 11/2004 | Shimoda et al. | |
| 6,885,389 B2 | 4/2005 | Inoue et al. | |
| 2002/0032073 A1* | 3/2002 | Rogers et al. | 473/324 |
| 2002/0067459 A1 | 6/2002 | Sugano | |
| 2002/0146893 A1 | 10/2002 | Shimoda et al. | |
| 2003/0008437 A1 | 1/2003 | Inoue et al. | |
| 2003/0032210 A1 | 2/2003 | Takayama et al. | |
| 2003/0082889 A1 | 5/2003 | Maruyama et al. | |
| 2003/0174275 A1* | 9/2003 | Asano et al. | 349/187 |
| 2003/0203547 A1 | 10/2003 | Sakaguchi et al. | |
| 2003/0217805 A1 | 11/2003 | Takayama et al. | |
| 2003/0224582 A1 | 12/2003 | Shimoda et al. | |
| 2004/0027055 A1* | 2/2004 | Yamazaki et al. | 313/498 |
| 2004/0129960 A1 | 7/2004 | Maruyama et al. | |

(Continued)

FOREIGN PATENT DOCUMENTS

JP 01-181570 7/1989

(Continued)

*Primary Examiner* — Thanh Nguyen
(74) *Attorney, Agent, or Firm* — Eric J. Robinson; Robinson Intellectual Property Law Office, P.C.

(57) ABSTRACT

It is an object of the present invention to improve a factor which influences productivity such as variation caused by a characteristic defect of a circuit by thinning or production yield when an integrated circuit device in which a substrate is thinned is manufactured. A stopper layer is formed over one surface of a substrate, and an element is formed over the stopper layer, and then, the substrate is thinned from the other surface thereof. A method in which a substrate is ground or polished or a method in which the substrate is etched by chemical reaction is used as a method for thinning or removing the substrate.

28 Claims, 26 Drawing Sheets

U.S. PATENT DOCUMENTS

| | | |
|---|---|---|
| 2004/0164302 A1 | 8/2004 | Arai et al. |
| 2004/0219762 A1 | 11/2004 | Shimoda et al. |
| 2004/0239827 A1 | 12/2004 | Yamazaki et al. |
| 2006/0030122 A1 | 2/2006 | Shimoda et al. |
| 2006/0057836 A1 * | 3/2006 | Nagarajan et al. ............ 438/622 |

FOREIGN PATENT DOCUMENTS

| | | |
|---|---|---|
| JP | 02-154232 | 6/1990 |
| JP | 04-170520 | 6/1992 |
| JP | 04-178633 | 6/1992 |
| JP | 04-299859 | 10/1992 |
| JP | 05-218365 | 8/1993 |
| JP | 06-291291 | 10/1994 |
| JP | 09-105896 | 4/1997 |
| JP | 2000-241822 | 9/2000 |
| JP | 2000-248243 | 9/2000 |
| JP | 2001-125138 | 5/2001 |
| JP | 2001-247827 | 9/2001 |
| JP | 2002-031818 | 1/2002 |
| JP | 2002-033464 | 1/2002 |
| JP | 2002-087844 | 3/2002 |
| JP | 2002-217391 | 8/2002 |
| JP | 2004-214281 | 7/2004 |
| JP | 2004-282050 | 10/2004 |
| WO | WO 2006/006611 | 1/2006 |
| WO | WO 2006/011664 | 2/2006 |

* cited by examiner

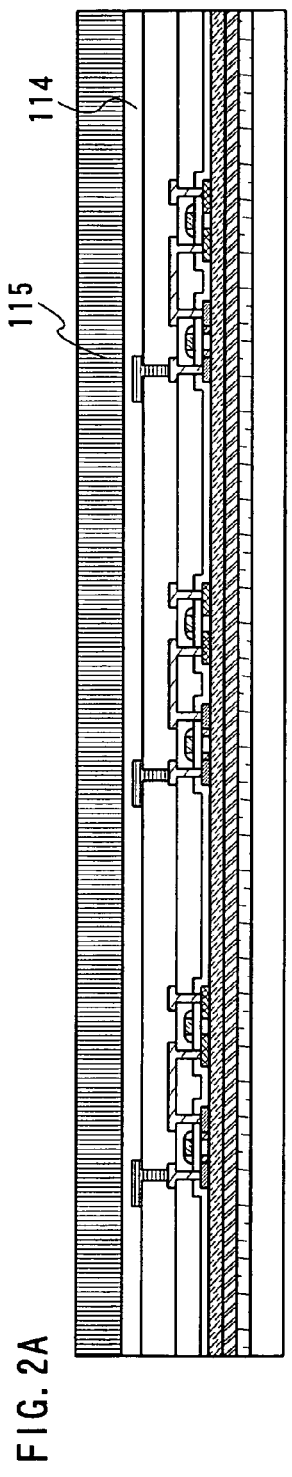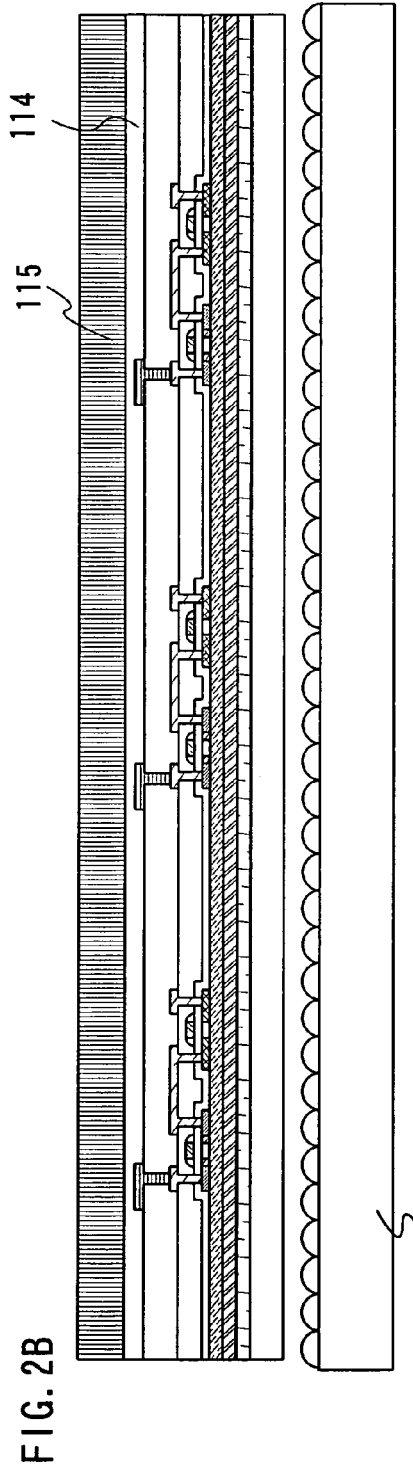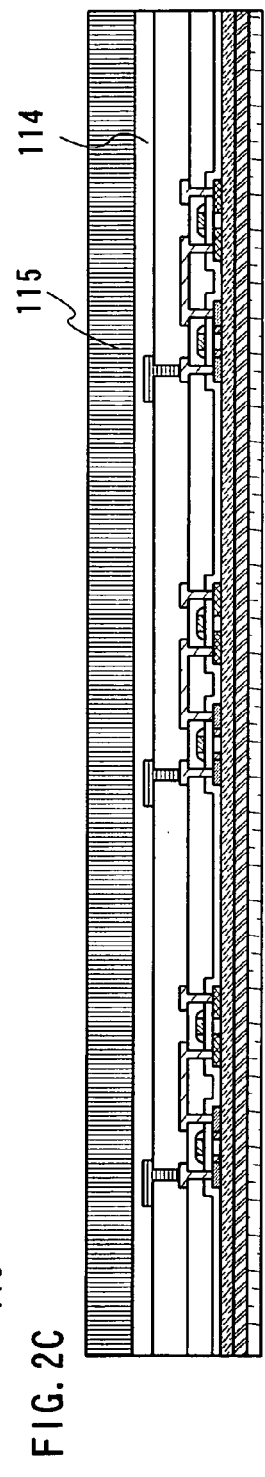

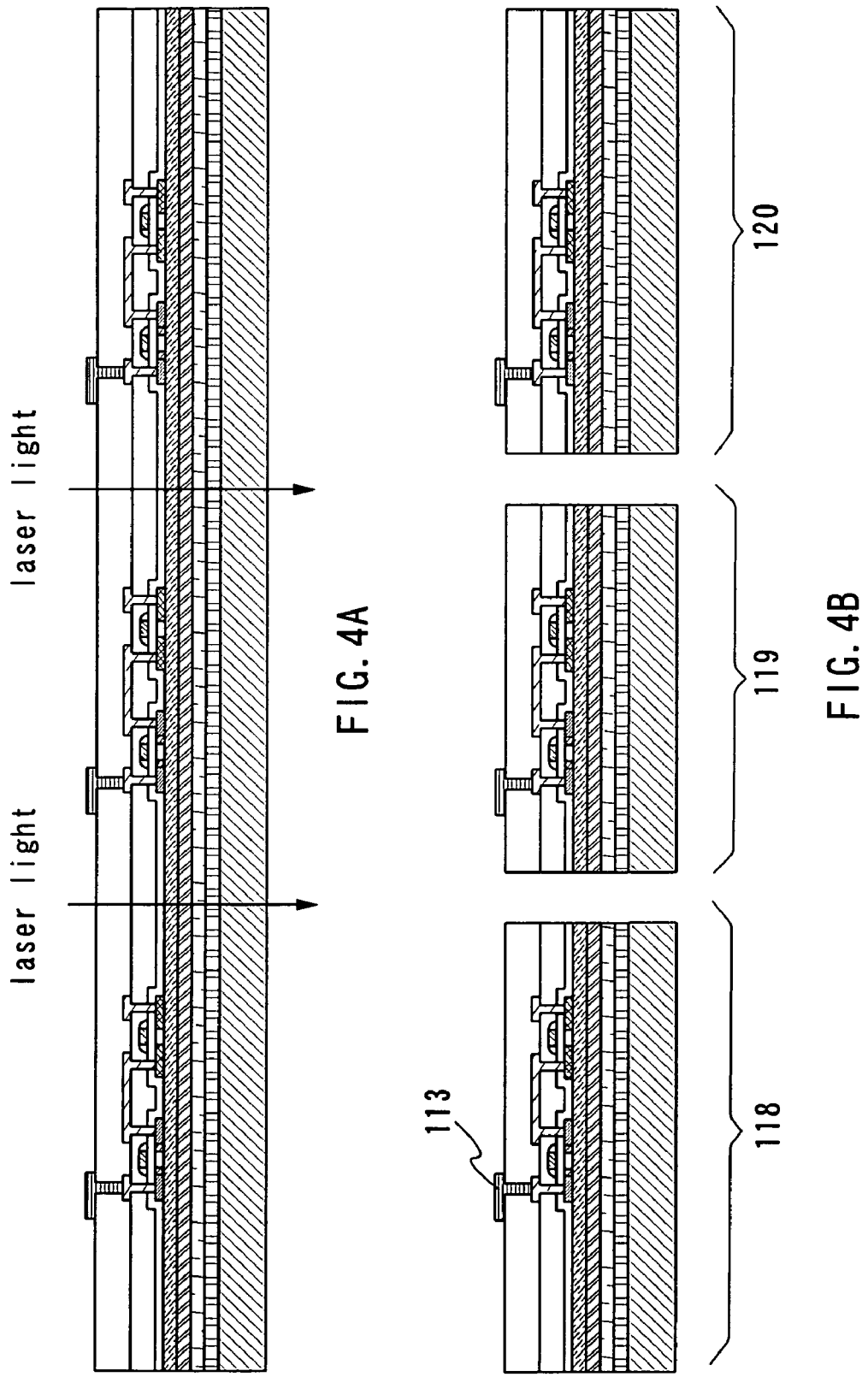

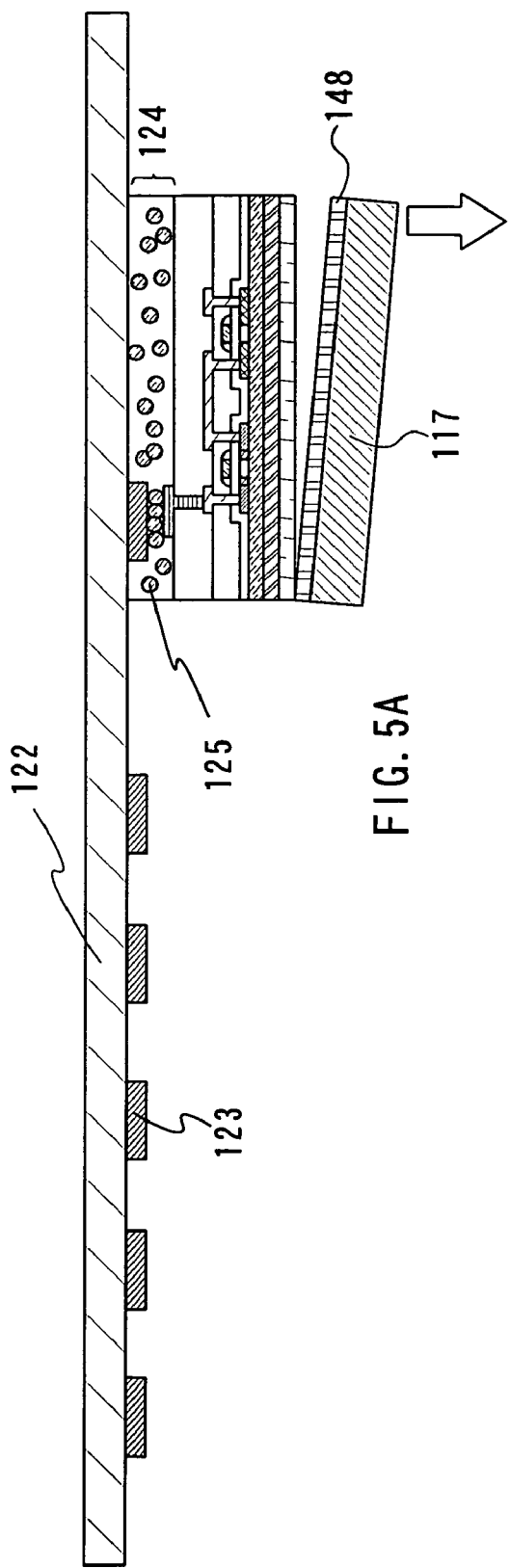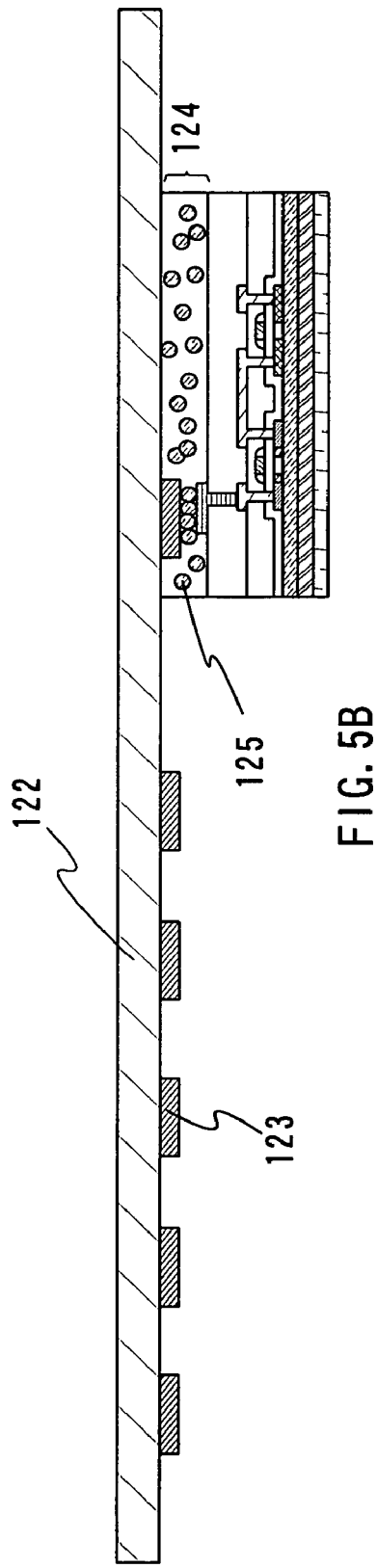

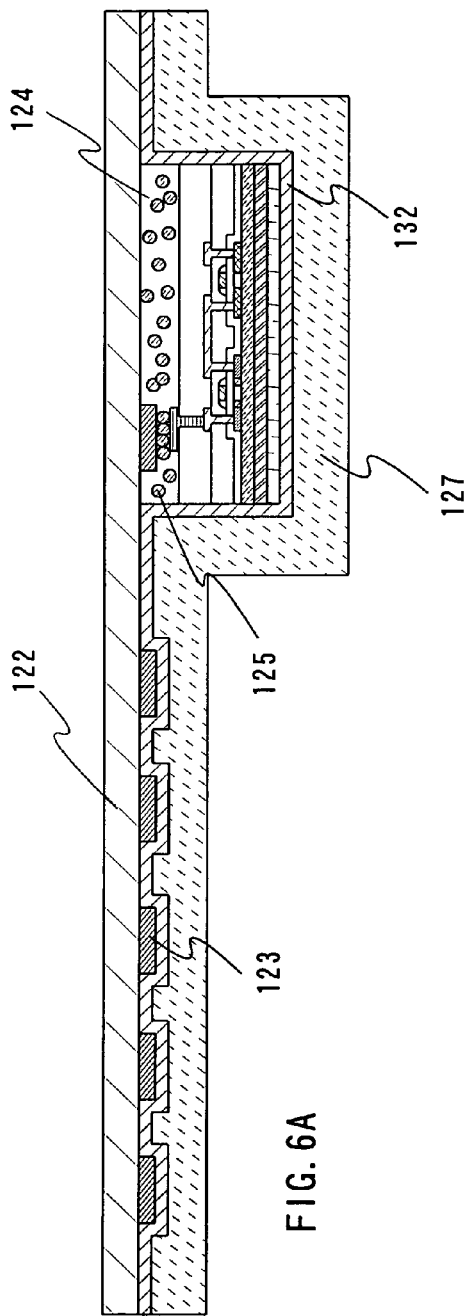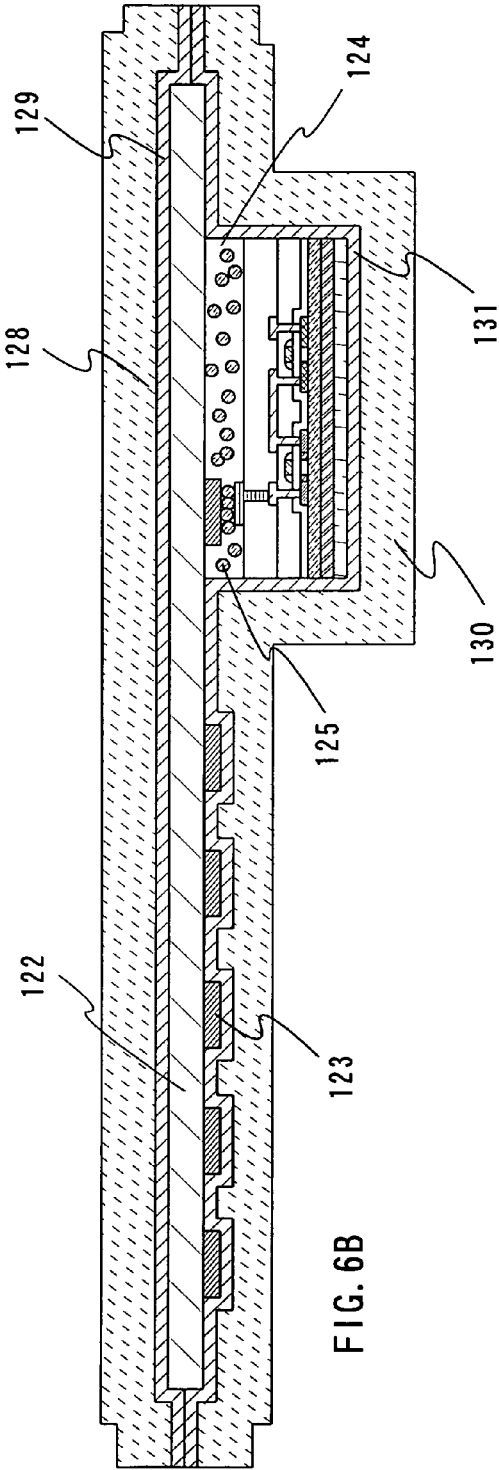

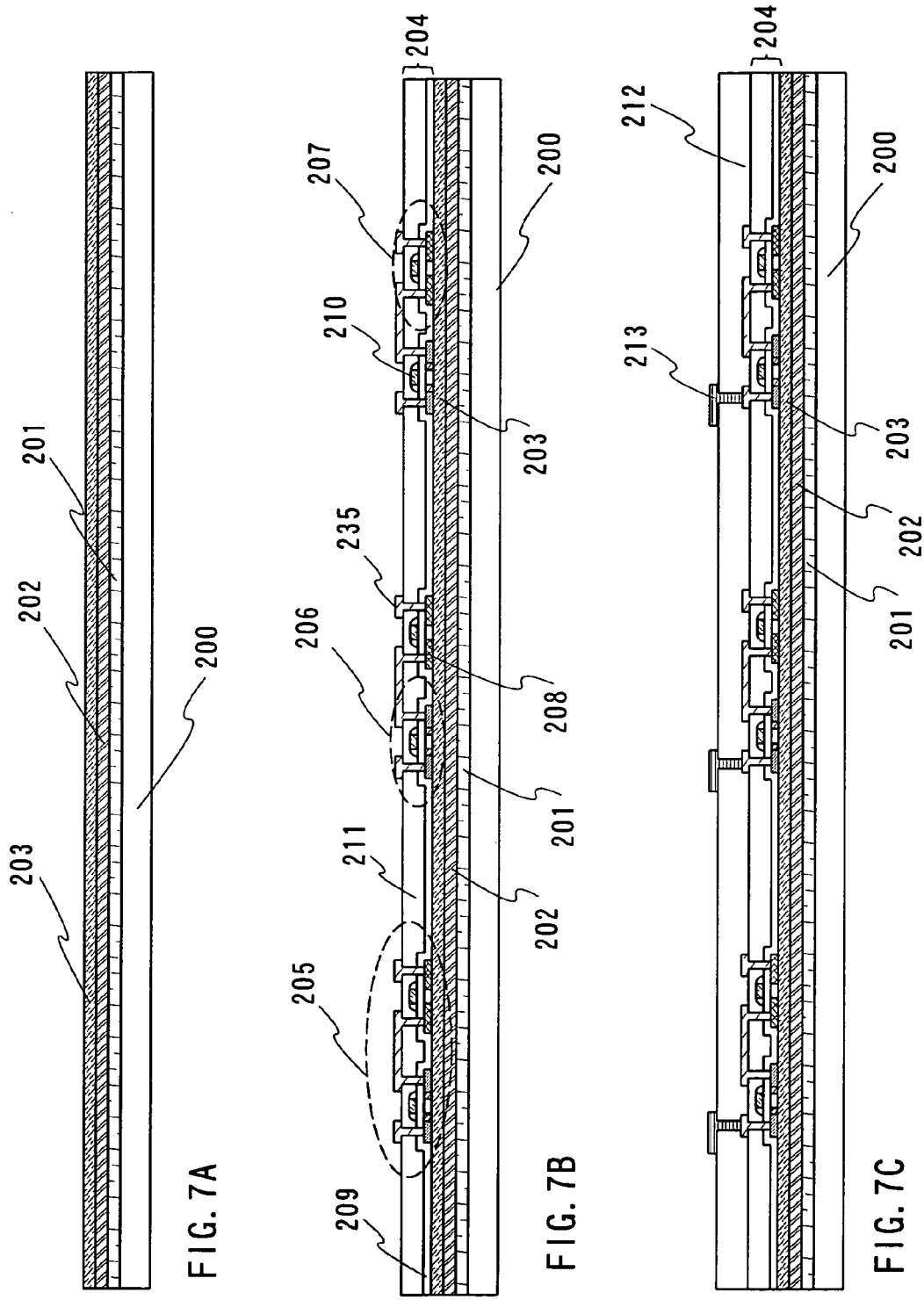

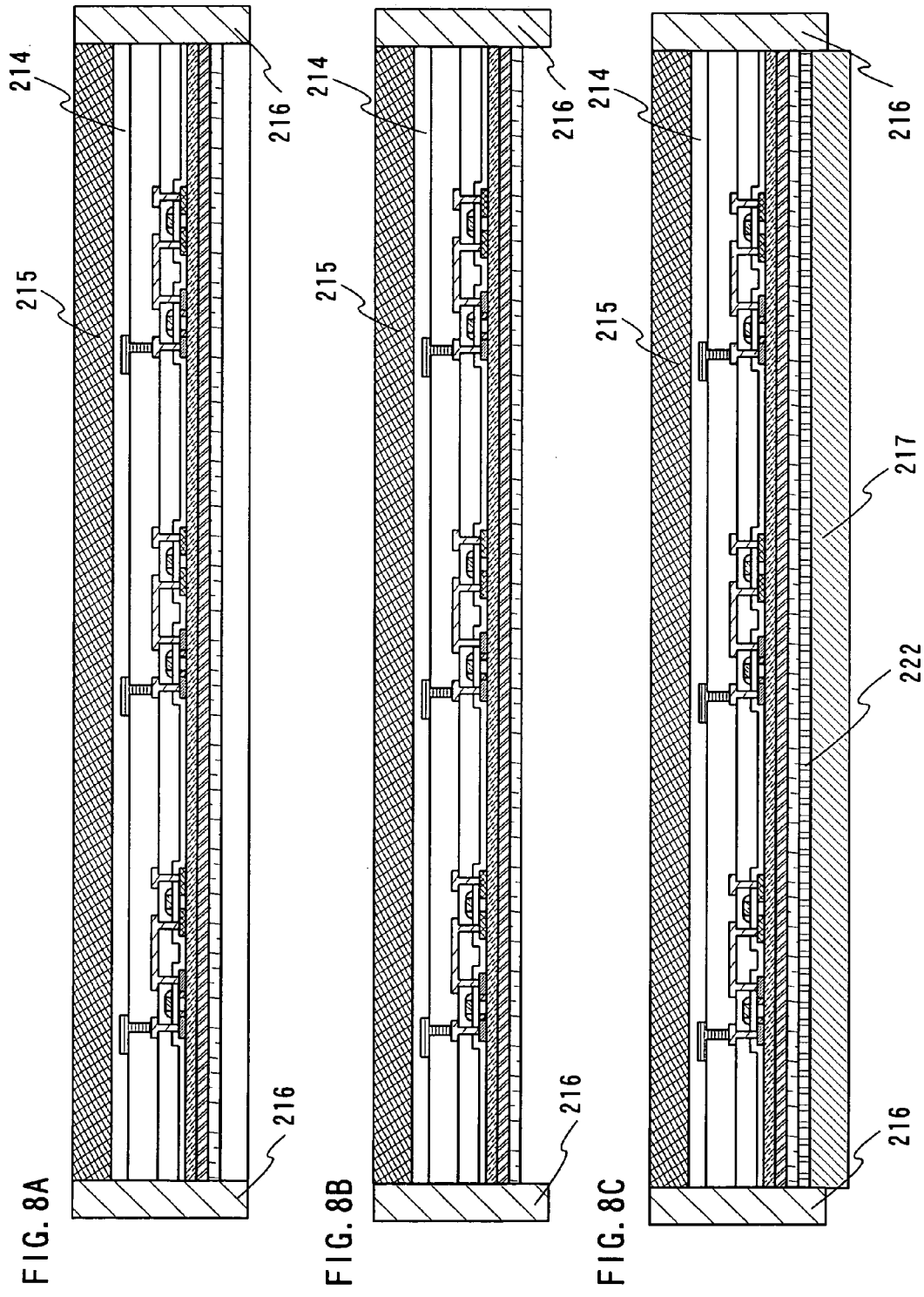

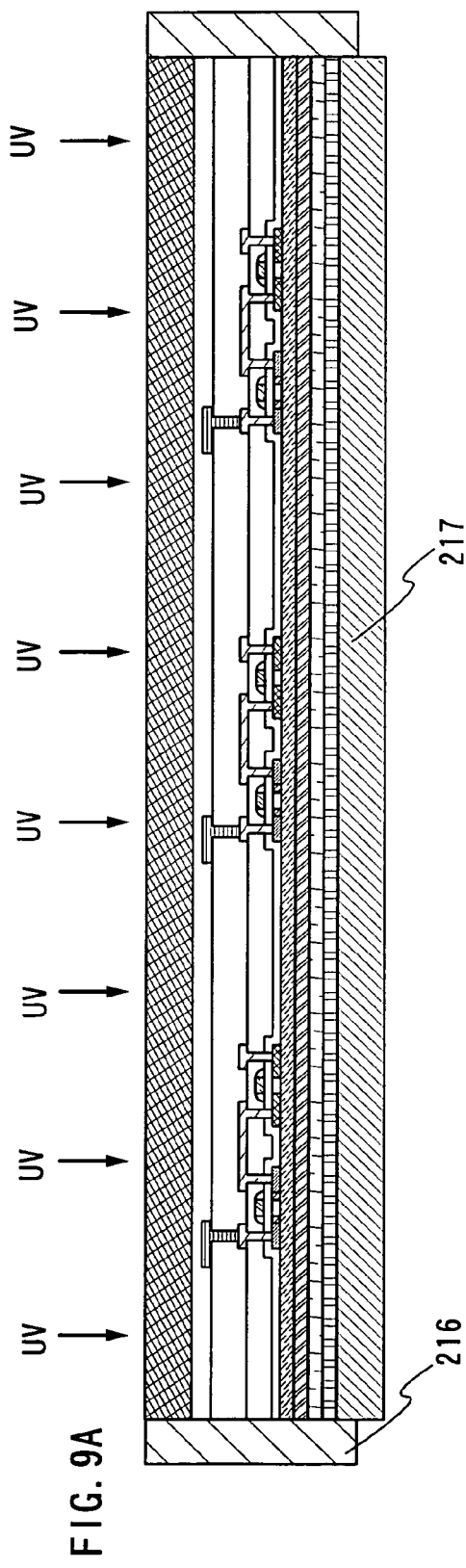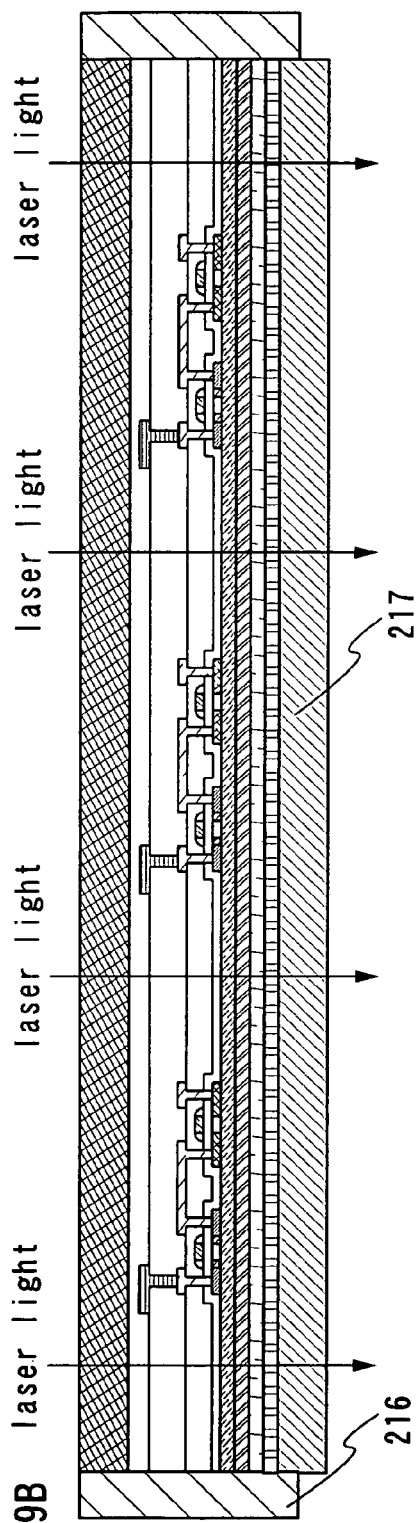
FIG. 9A
FIG. 9B

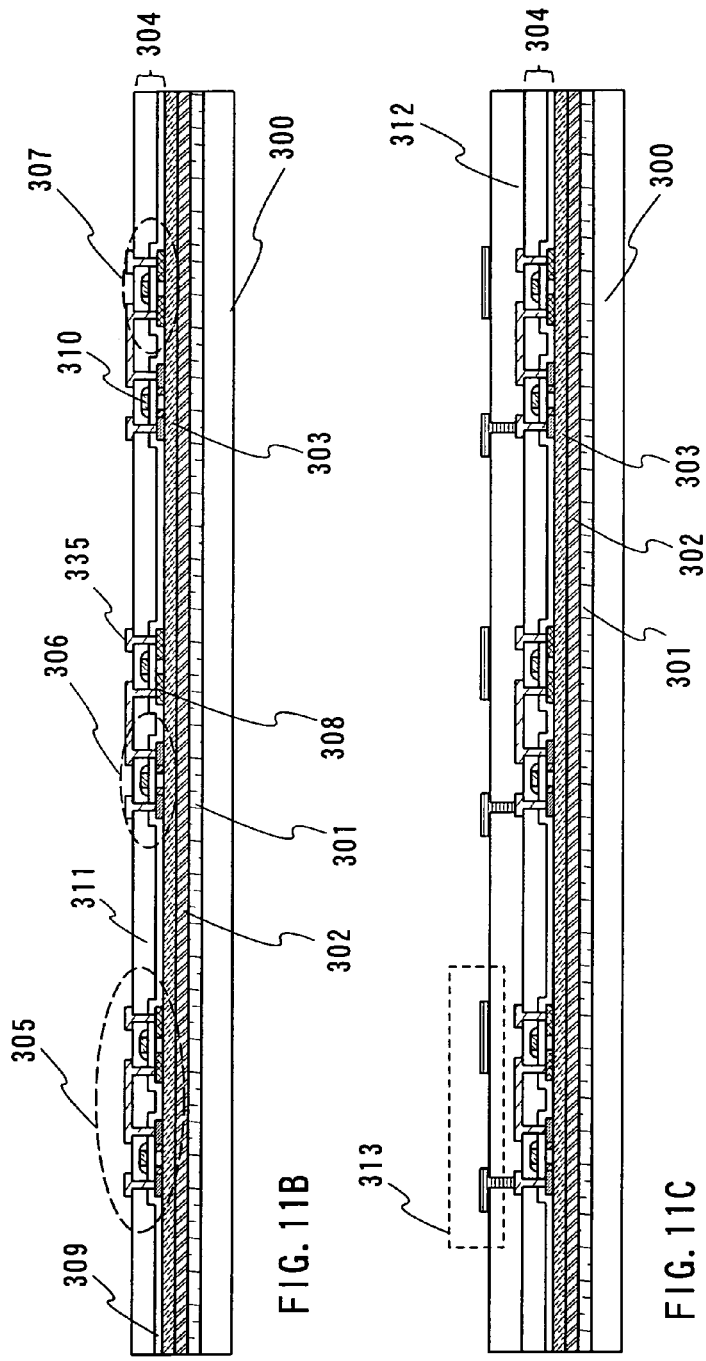

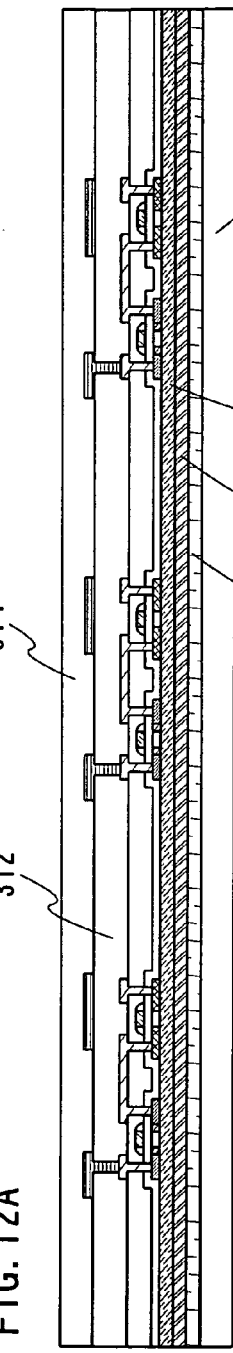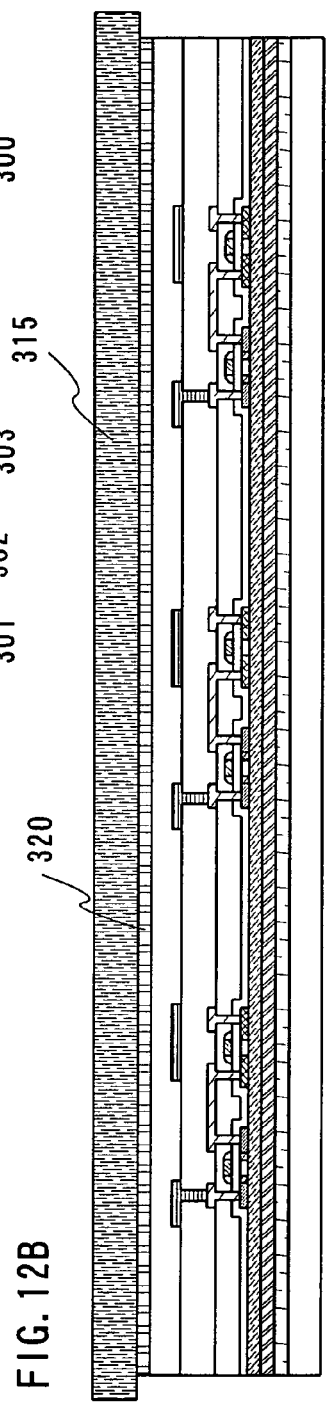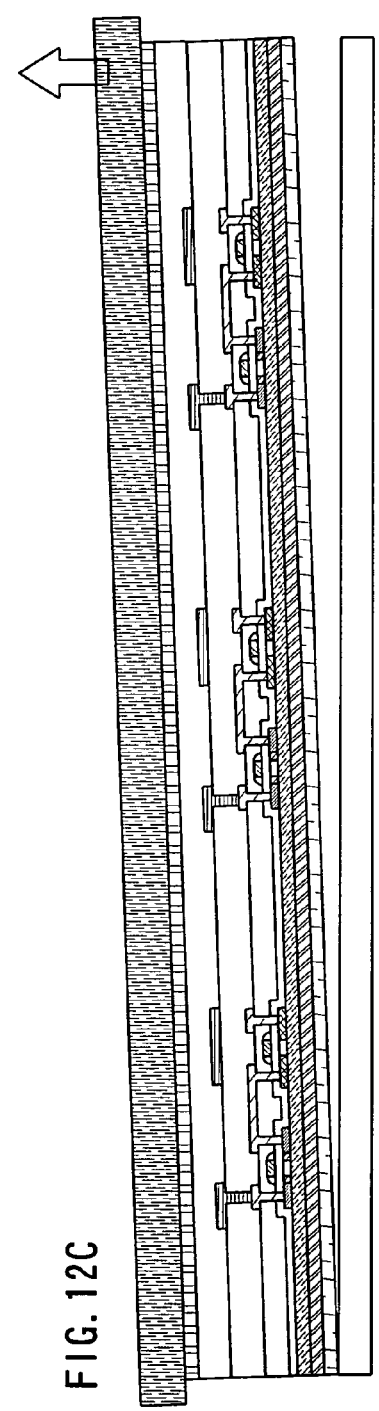

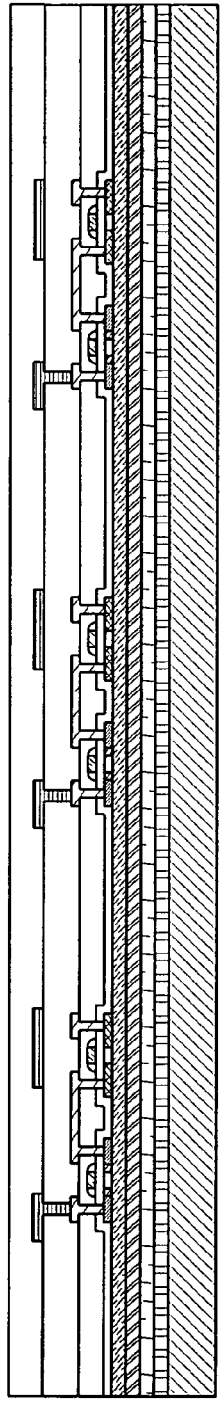
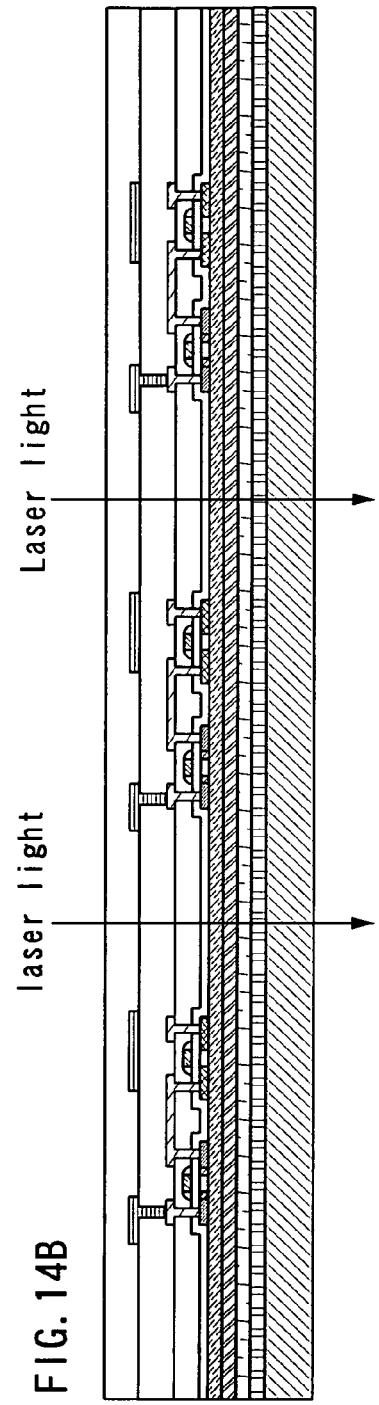
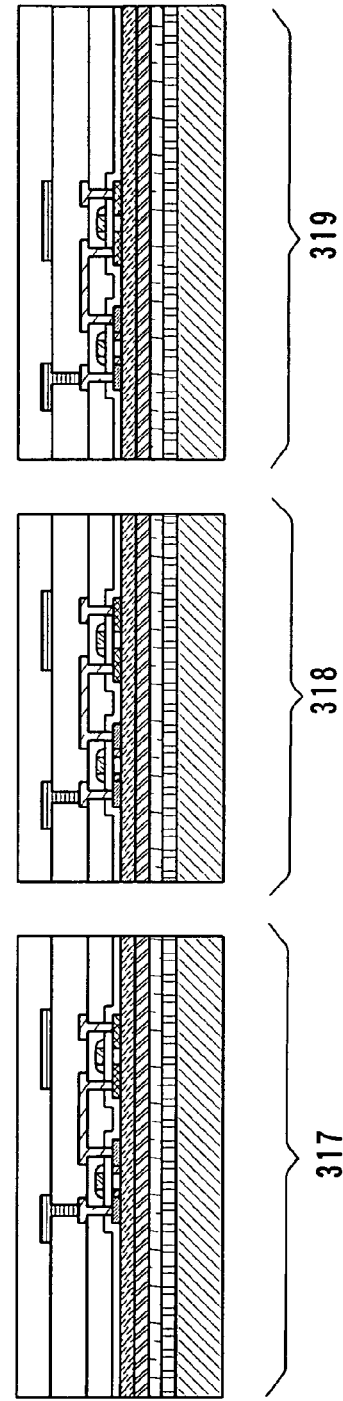
FIG. 14A
FIG. 14B
FIG. 14C

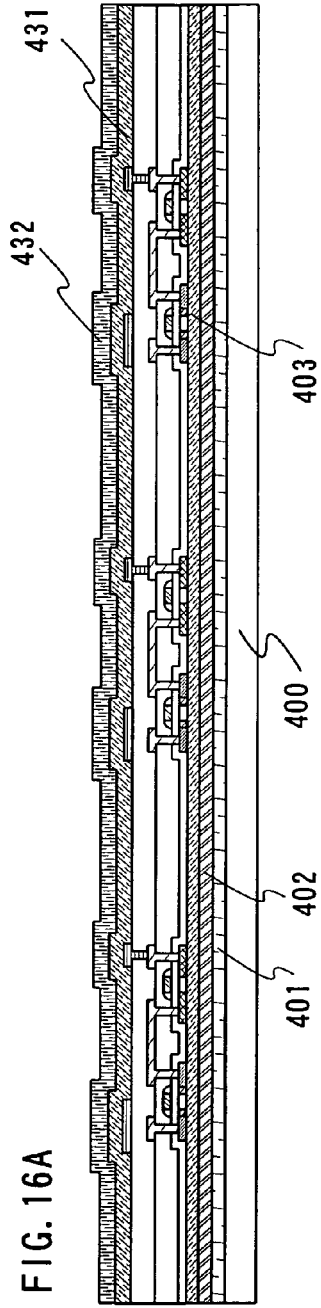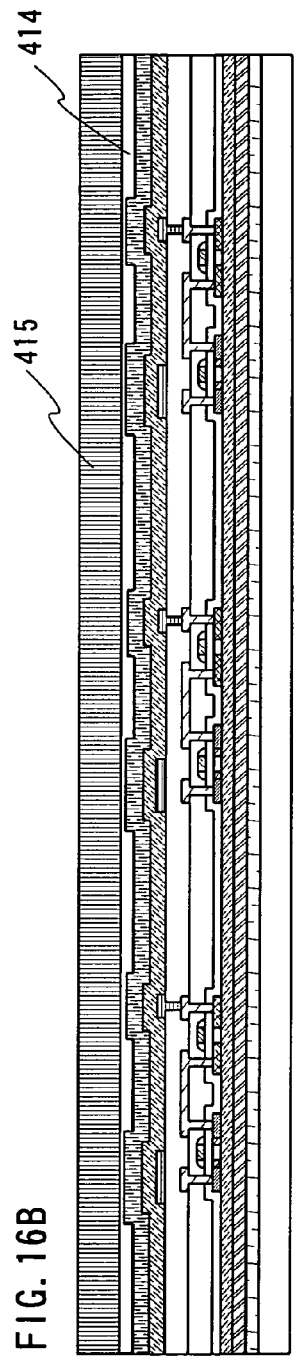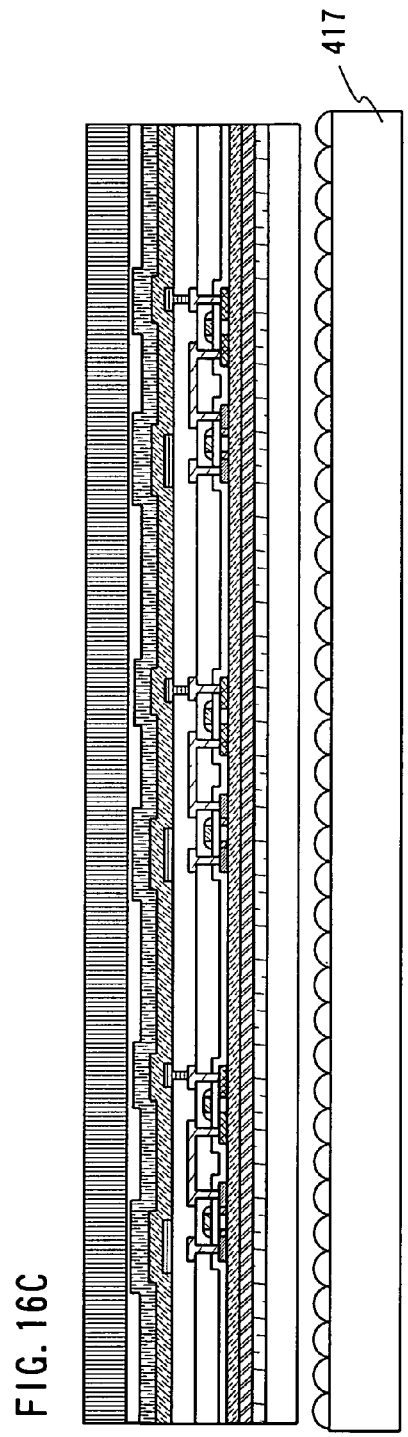

laser light
laser light 421
420
419

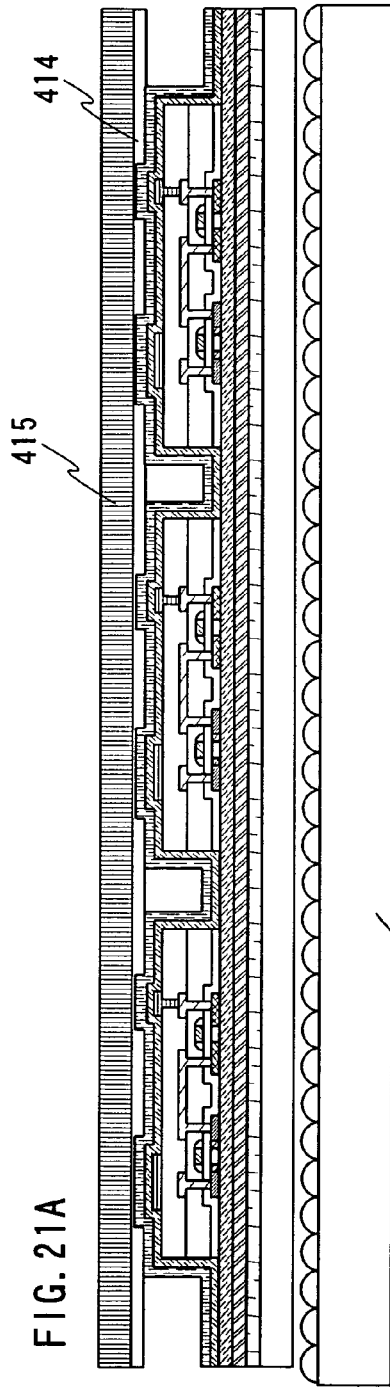
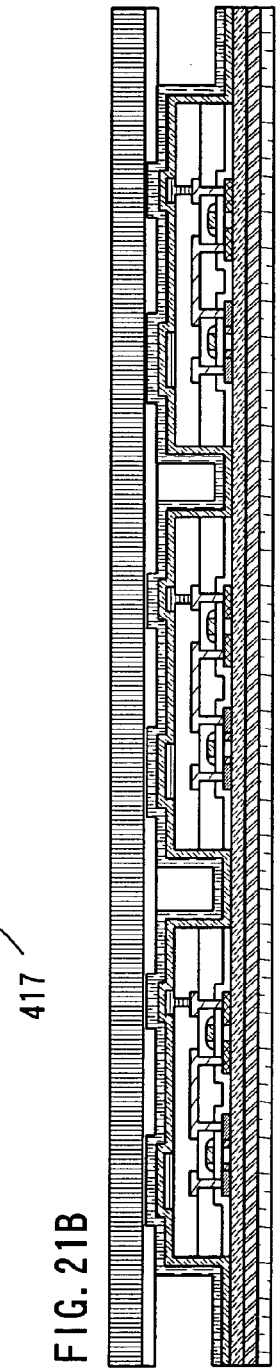
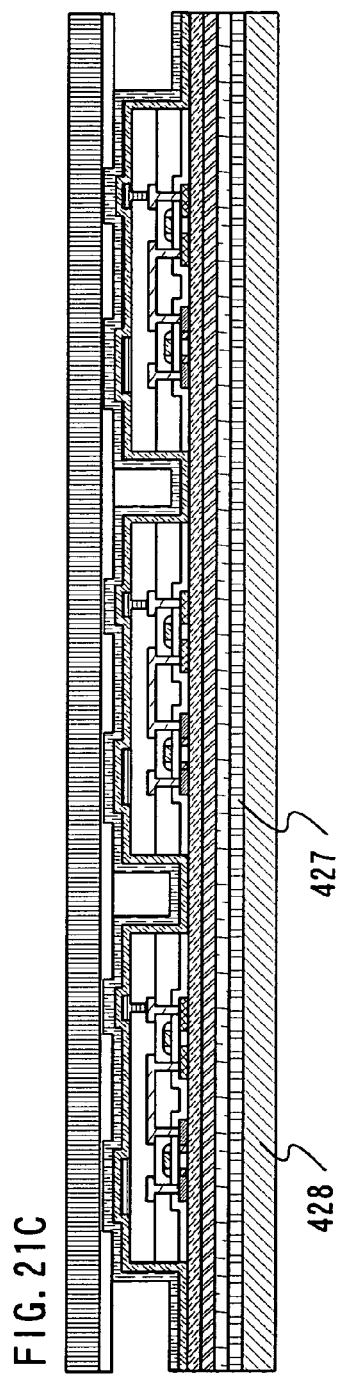
FIG. 21A
FIG. 21B
FIG. 21C

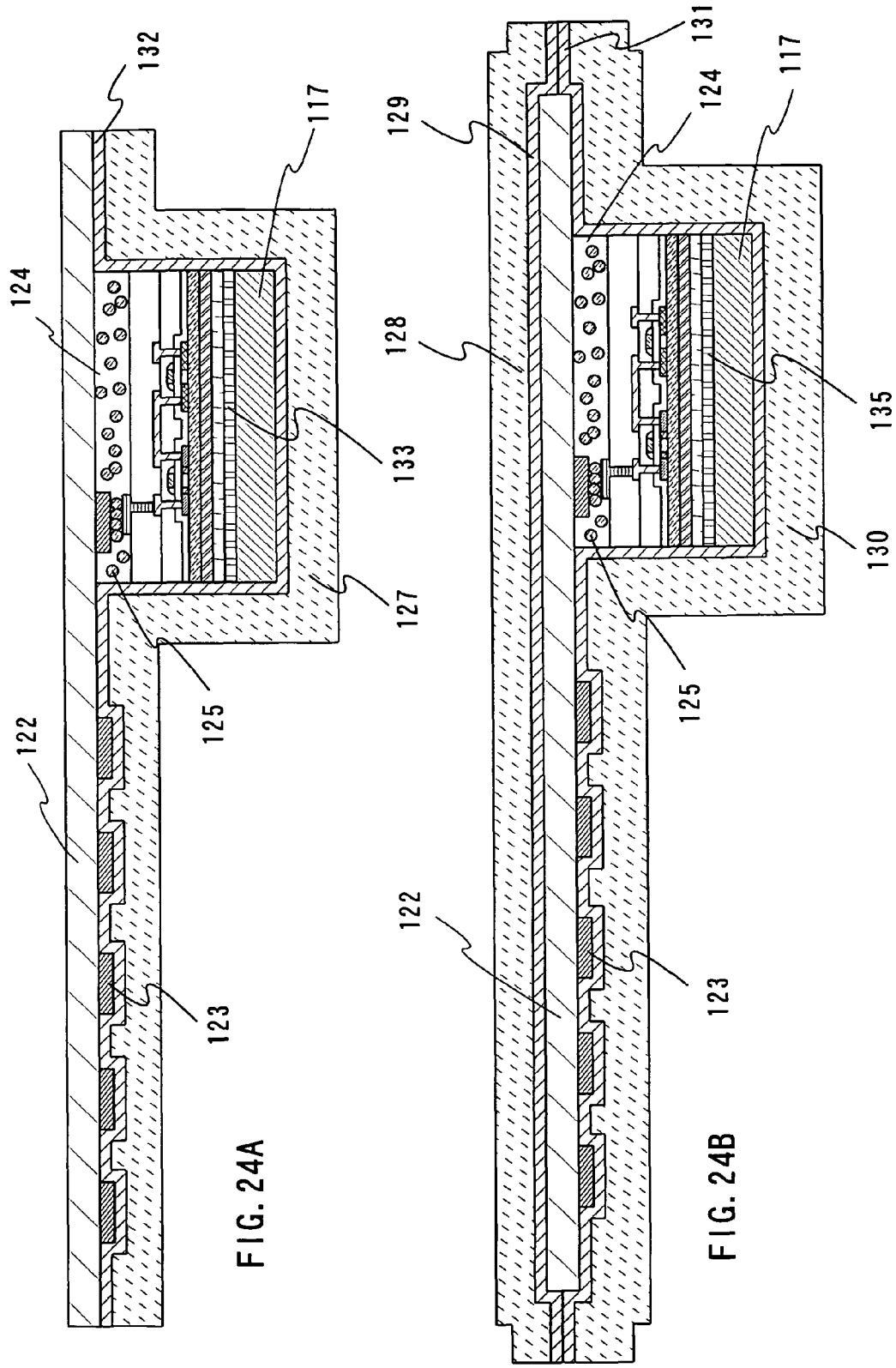

MANUFACTURING METHOD OF INTEGRATED CIRCUIT DEVICE INCLUDING THIN FILM TRANSISTOR

BACKGROUND OF THE INVENTION

1. Field of the Invention

The present invention relates to an integrated circuit device and a manufacturing method thereof.

2. Description of the Related Art

In recent years, an element and an integrated circuit over a glass substrate are developed actively for using of a display such as an LCD, an organic EL, a photo sensor, a solar battery, or a photoelectric conversion element. Meanwhile, in an element and an integrated circuit using a Si wafer, miniaturization and thinning of an IC chip are advansed for use of a mobile phone. On either glass or a Si wafer, miniaturization and thinning are needed strongly. In addition, a semiconductor device which transmits and receives data (IC chip) has been developed actively. Such a semiconductor device (IC chip) is referred to as an RF tag, a wireless tag, an electronic tag, a wireless processor, a wireless memory, or the like (for example, see Reference 1: Japanese Patent Laid-Open No. 2004-282050). An IC chip using a silicon substrate is mainly in pratical use, and a display or the like using a glass substrate is mainly in pratical use, and thinning of a substrate is required.

In addition, as well as being thinner, a flexible device such as an RFID embedded in a paper, a display which can be wrapped around onto a pen, a forming sensor for a three-dimensional shape or a color sensor, a hand roll PC, or clothes in which the design is changed by changing the color. Therefore, thinning is an important key.

When an element is formed by using a substrate which is made thinner from the start, a substrate cassette becomes huge in height direction, and footprint of a device or a substrate is increased when warpage of a substrate is considered. In addition, difficulty of handling, warpage by stress, or displacement in a process such as lithography or printing becomes a problem. Therefore, a method in which an element is manufactured and then a substrate is made thinner is used.

About thinning a substrate using grinding or polishing, planarity of the substrate is improved using by a polishing process using abrasive grains after grinding using abrasive grains, a film has been formed to be thinner. An abrasive grains having a lower Vickers hardness than a substrate to be polished tend to be used for an artifice for increasing an evenness property. For example, cerium oxide ($CeO_2$) is used to a glass substrate or silicon oxide ($SiO_2$) is used for a silicon wafer, or the like, and cerium oxide and silicon oxide have lower Vickers hardness than a substrate; however, only a portion which is attached firmly to an object by chemical reaction can be polished selectively (see Reference 1: Japanese Patent Laid-Open No. 2004-282050). Note that, here, the hardness is compared by using Vickers hardness; however, the hardness is sometimes shown in a method other than Vickers hardness (Brinell hardness, Rockwell hardness, Knoop hardness, or the like).

In addition, there is a technique in which a glass substrate is removed by wet etching by chemical reaction (see Reference 2: Japanese Patent Laid-Open No. 2002-87844).

In addition, there is a technique in which an element formed over a substrate is physically peeled from the substrate and transferred to another substrate by controlling adhesion of a peeling layer formed under an element (see Reference 3: Japanese Patent Laid-Open No. 2004-214281).

When, in a semiconductor device such as an IC chip having an integrated circuit device, a substrate over which an element is formed is made thinly by grinding and polishing, there is a limit of thinning by a limit of accuracy of a device and in-plane uniformity of polishing; therefore, it has been difficult to make the entire surface have thickness of 50 μm or less.

When warpage of in-plane of a substrate is considered, it is necessary that a substrate is divided and made a small planar dimension, and warpage of in-plane is reduced and processed in order to make a substrate thinner with high yield, and it is a factor of throughput degradation and cost increase. Therefore, even when a multiplicity of samples in which a minimum of a substrate residual film in a whole surface is more than 50 μm in thickness is obtained, a minimum of a substrate residual film in a whole surface becomes 50 μm more (100 μm or 200 μm) when improving yield on a mass production is considered.

When a substrate in which an element is formed is made thinner by wet etching using a chemical solution, it has been very difficult to make a substrate thinly to a thickness of 50 μm or less with high uniformity and high yield since there is a limit of thinning due to variation caused in the etching rate of in-plane at a time of etching using a chemical solution.

When a substrate is removed by a method using etching by chemical reaction of Reference 2, it has been be a great limit that heat treatment at a temperature higher than a temperature of an allowable temperature of an etching stopper layer formed under an element cannot be performed.

When an element is separated from a substrate and is transposed to another substrate by a method using controlling of adhesion in Reference 3, there is a problem that a capacitance is generated between a separation layer and an element and a properties before separating (in particular, a high frequency property) is not evaluated accurately.

In addition, it is an advantage of this technique that a separation property can be controlled by heating; however, there is a demand for heat treatment at a more temperature at which a separation layer is separated in a process or more.

In addition, in References 2 and 3, when heat process (laser crystallization, laser activation, or the like) with visible light is performed, the process margin has been reduced by optical reflection or heat absorption in an etching stopper layer or a separation layer.

In References 2 and 3, when a substrate which is transparent to light is used, self alignment by back light exposure is not able to be performed in a conductive separation layer.

SUMMARY OF THE INVENTION

In view of the foregoing, it is an object of the present invention to make an integrated device thin and flexible by making a substrate over which an element is formed thinner and removing the substrate.

In a case where an element such as a TFT is formed over a substrate and the substrate over which an element is formed is made thin, if a part of a layer where an element such as a TFT is formed as well as a substrate disappears is disappeared, abnormal properties are found.

Then, it is another object of the present invention to form an element over a substrate and to control abnormal properties due to disappearance of a part of an element which is caused when the substrate on which an element is formed is made thin, thereby improving manufacturing yield.

Further, when a semiconductor substrate or a conductive substrate is used as a substrate over which an element is formed, the following problems occur. In the case of the semiconductor substrate, for example, when a Si wafer has a thickness of 10 μm or less, variations in the substrate thickness affects element properties. In addition, in the case of a conductive substrate, variation of a substrate thickness affects an element properties unless the substrate thickness becomes thin to approximately "0" (removing the substrate almost completely). Therefore, even if a substrate is become thinly, it is difficult to control variation in the properties.

For countermeasures against a problem by such variation in a substrate thickness, for example, there is a method in which an insulating film is formed over a semiconductor substrate or a conductive substrate and then an element is formed as in an SOI substrate. This method is more effective to save electrical power, and high frequency properties become good. However, in this case, when a substrate is made thin to the limit, the capacitance properties are changed and property variation of an element such as a TFT may increase due to variation of whether a Si substrate remains or not under an insulating film formed under an element such as a TFT. Property variations are significant in the case where a part of a substrate disappears by being thinner. This also applied to not only a case of using a Si wafer but also to a case of using another semiconductor substrate or a conductive substrate.

It is until another object of the present invention to form an element over a substrate, and to improve factors which greatly affects mass production such as property variations which are caused when a substrate over which an element is formed is made thin, or manufacturing yield in the case of using a semiconductor substrate or a conductive substrate as a substrate.

In addition, since a silicon substrate is expensive, and the substrate is round and has a diameter of 12 inches (30 centimeters), mass-production of silicon substrates is difficult and it has been an obstacle to a reduction in costs. Thus, a plurality of IC chips can be formed at low cost by using a glass substrate; however, a glass substrate has a problem that there is more warpage than a Si wafer or a quartz substrate, and it has been difficult to make a whole surface thinner uniformly. Since this problem is significant in a large-sized substrate, it has been necessary to thin a substrate after dividing the substrate to a small dimensions substrate in order to make the substrate thinner with high accuracy.

In view of the foregoing, it is a further object of the present invention to form an element which is inexpensive can be mass-produced, and has little variation even in the case of a thin film.

In the present invention, a stopper layer is formed over one surface of a substrate, and an element is formed over the stopper layer, and the substrate is made thinly from the other surface of the substrate.

In the present invention, a stopper layer is formed over one surface of a substrate, and an element is formed over the stopper layer, and a substrate is removed.

In the present invention, a method in which a substrate is grinded or polished is used for being a substrate thinly or removing a substrate, and a stopper layer is formed with a material having higher hardness than a substrate.

In the present invention, a method in which a substrate is etched by chemical reaction is used for making a substrate thin or removing a substrate, and a stopper layer is formed with a material which is resistant to an etchant used when etching by chemical reaction is performed.

In addition, in the above configuration, a stopper layer is formed with a material which mainly contains diamond like carbon.

In each of the above structures, a layer (buffer layer) for improving adhesion between a substrate and a stopper layer is formed between a substrate and a stopper layer.

In each of the above structures, a layer (buffer layer) to improve adhesion between a stopper layer and an element is formed between a stopper layer and an element.

In the present invention, a layer (DLC layer) which mainly contains diamond like carbon is formed over one surface of a substrate, and an element is formed over the layer which mainly contains diamond like carbon, and the substrate is removed by controlling adhesion between a DLC layer and the substrate.

In the present invention, a method in which a substrate is separated by controlling adhesion between a DLC layer and a substrate is used as a method in which a substrate is removed.

In the present invention, a substrate is made thinner or removed by combining plural methods among a method in which a substrate is grinded or polished, a method in which a substrate is etched by chemical reaction, a method in which a substrate is separated by controlling adhesion between a DLC layer and a substrate.

The thickness of the thinned substrate is 100 μm or less, preferably, 20 μm or less, more preferably, 10 μm or less.

According to the present invention, since a substrate can be made thinner or be removed, an integrated circuit device thinner than before can be provided.

When a grinding method or a polishing method is used for making a substrate thinner or removing a substrate, due to the presence of a stopper layer, a layer formed above the stopper layer can be prevented from being grinded or polished. Therefore, an integrated circuit device thinner than before can be provided.

When an etching method by chemical reaction is used for making a substrate thinner or removing a substrate, due to the presence of a stopper layer, a layer formed above the stopper layer can be prevented from being etched. Therefore, an integrated circuit device thinner than before can be provided.

In particular, when diamond like carbon (DLC) is used as a stopper layer, conditions for heating an element formed thereover is not limited due to the heat resistance of DLC.

When a separating method by controlling adhesion of DLC is used for making a substrate thinner or removing a substrate, a substrate can be removed due to the presence of a DLC layer. Therefore, an integrated circuit device thinner than before can be provided. In addition, heat treatment can be performed without significantly changing the adhesion due to heat resistance of DLC. Therefore, there is an advantage that process restrictions are reduced in manufacturing a thin integrated circuit device.

By using an insulating substrate, effects of variations in the thickness of a thinned substrate, or variations in element properties or capacitance due to a residue of a substrate can be prevented.

Even when an element is formed over a semiconductor substrate such as an Si wafer or an SOI substrate or a conductive substrate, by removing a substrate using the present invention, effects of variations in the thickness of a thinned substrate (in the case of a substarate is 10 μm thickness or less), or variations in an element properties or capacitance due to a residue of a substrate (in the case where even a part of a substrate is 0 μm) can be prevented.

The present invention can use a substrate of which size is not limited such as a glass substrate. In the present invention, the price of an IC chip is reduced compared with the case of using a silicon substrate and mass-production can be performed.

BRIEF DESCRIPTION OF THE DRAWING

FIGS. 2A to 2C are diagrams describing Embodiment Mode 1;

FIGS. 4A and 4B are diagrams describing Embodiment Mode 1;

FIGS. 5A and 5B are diagrams describing Embodiment Mode 1;

FIGS. 6A and 6B are diagrams describing Embodiment Mode 1;

FIGS. 7A to 7C are diagrams describing Embodiment Mode 2;

FIGS. 8A to 8C are diagrams describing Embodiment Mode 2;

FIGS. 9A and 9B are diagrams describing Embodiment Mode 2;

FIGS. 11A to 11C are diagrams describing Embodiment Mode 3;

FIGS. 12A to 12C are diagrams describing Embodiment Mode 3;

FIGS. 14A to 14C are diagrams describing Embodiment Mode 3;

FIGS. 16A to 16C are diagrams describing Embodiment Mode 4;

FIGS. 21A to 21C are diagrams describing Embodiment Mode 4;

FIGS. 24A and 24B are diagrams describing Embodiment Mode 1;

DETAILED DESCRIPTION OF THE INVENTION

Figure 1A:
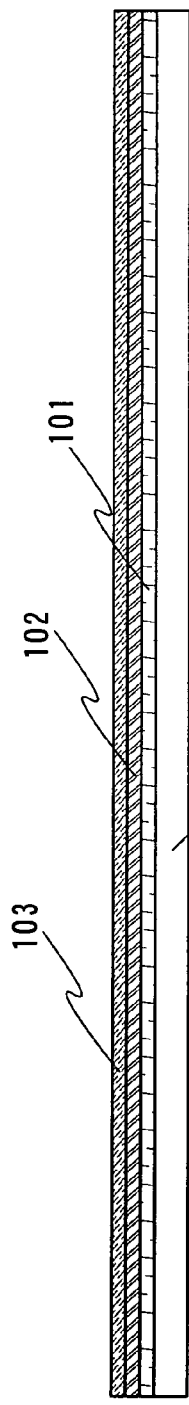
FIGS. 1A to 1C are diagrams describing Embodiment Mode 1.

Hereinafter, embodiment modes of the present invention will be described in detail with reference to the accompanying drawings. However, the present invention is not limited to the description below, and it is easily understood by those skilled in the art that modes and details can be modified in various ways without departing from the spirit and the scope of the present invention. Therefore, the present invention should not be understood as being limited to the description of the embodiment modes to be given below. Note that in the structures of the present invention described below, the reference numerals indicating the same are used in common in the drawings.

Embodiment Mode 1

This embodiment mode is described using FIGS. 1A to 6B. In this embodiment mode, an example in which a layer which mainly contains diamond like carbon is formed over a substrate as a stopper layer in a case that a substrate is made thinly by grinding and polishing is described.

A layer (DLC layer) which mainly contains DLC (diamond like carbon) is formed over a first substrate 100. It is preferable that a layer for improving adhesion (buffer layer) is formed between the first substrate 100 and the DLC layer, and between the DLC layer and a layer formed over the DLC layer. In this example, a layer for improving adhesion (buffer layer) 101, a DLC layer 102, and a layer for improving adhesion (buffer layer) 103 are formed sequentially over one surface of the first substrate 100 (see FIG. 1A). In this particular example, before forming a DLC layer 102, a layer which mainly contains DLC which contains Si at a concentration of 1 to 20% is formed as the layer for improving adhesion (buffer layer) 101, and after film formation of the DLC layer 102, a layer which mainly contains DLC which contains Si at a concentration of 1 to 20% is formed as the layer for improving adhesion (buffer layer) 103.

In FIG. 1A, the layers for improving adhesion (buffer layers) 101 and 103 are provided; however, if there is no particular problem in adhesion between the first substrate 100 and the DLC layer, or the DLC layer and a layer formed over the DLC layer, the layer for improving adhesion (buffer layer) 101 or the layer for improving adhesion (buffer layer) 103 does not have to be formed necessarily.

The DLC layer 102 is formed by a PECVD method using gas including carbon such as $CH_4$ gas, or by coating by implanting a carbon ions.

The layers for improving adhesion (buffer layers) 101 and 103 are formed by streaming gas including Si such as $SiH_4$ gas with gas including carbon such as $CH_4$ gas and using a PECVD method, or streaming gas including Si such as $SiH_4$ gas at the same time when coating is performed by implanting carbon ions. At this time, gas including nitrogen such as $N_2$ gas or $NH_3$ gas is streamed instead of $SiH_4$, so that layers which mainly contains DLC including nitrogen may be formed as the layers for improving adhesion (buffer layers) 101 and 103 instead.

As a manufacturing method of the layer for improving adhesion (buffer layer) 101, a surface of the first substrate may be nitrided by performing high-density plasma treatment using a gas mainly containing nitrogen such as $N_2$ gas or $NH_3$ gas to the first substrate, or the surface or vicinity of the first substrate may be nitrided by doping or ion implanting nitrogen ions to the substrate. In addition, the layer for improving adhesion (buffer layer) 101 may be formed as a DLC film including nitrogen by forming a DLC film and performing high-density plasma treatment using gas which mainly contains nitrogen such as $N_2$ gas or $NH_3$ gas to be nitrided the DLC film or a nitrogen ion is doped or performed ion implantation to the DLC film to be nitrided the DLC film. A layer which has good adhesion with DLC may be formed such as a WC (tungsten carbide) film, a BCN (boron carbonitride) film, a BN (boron nitride) film, a DLC film added with SiC (silicon carbide) or Ti as the layer for improving adhesion (buffer layer) 101.

As a forming method of the layer for improving adhesion (buffer layer) 103, a surface of the DLC layer 102 may be nitrided by performing high-density plasma treatment using a gas mainly containing nitrogen such as $N_2$ gas or $NH_3$ gas to the DLC layer 102, or the the DLC layer 102 may be nitrided by doping or ion planting nitrogen ions, and then the DLC film including nitrogen may be formed. A layer which has good adhesion with DLC may be formed such as a WC (tungsten carbide) film, a BCN (boron carbonitride) film, a BN (boron nitride) film, a DLC film added SiC (silicon carbide) or Ti as the layer for improving adhesion (buffer layer) 103.

In this specification, the "high-density plasma treatment" indicates treatment in which an electron density of plasma is $1 \times 10^{11}$ cm$^{-3}$ or more and $1 \times 10^{13}$ cm$^{-3}$ or less, and an electron temperature of plasma is 0.5 eV or more and 1.5 eV or less. Since the electron temperature in the vicinity of an object formed over a substrate is low while the electron density of plasma is high, damage due to plasma of the substrate can be prevented. Further, since the electron density of plasma is high as $1 \times 10^{11}$ cm$^{-3}$ or more, a dense film with a uniform thickness, which is formed of oxide generated by oxidation treatment, can be formed. Further, the electron temperature of plasma is low as 1.5 eV or less, and therefore, oxidation treatment can be performed at a lower temperature as compared with normal plasma treatment or thermal oxidation. For example, even when plasma treatment is performed at a temperature lower than a strain point of the glass substrate by about 100° C. or more (for example, 250 to 550° C.), plasma oxidation treatment can be sufficiently performed. Note that, as a power supply frequency for generating plasma, a microwave (2.45 GHz) is used. Further, potential of plasma is low as 5 V or less so that excessive dissociation of molecules of a raw material can be suppressed.

As the first substrate 100, any one of a glass substrate, a quartz substrate, an Si substrate, a semiconductor substrate, a plastic substrate, an acrylic substrate (a kind of a plastic substrate), a metal substrate, or the like can be used as long as it can endure maximum temperature in a manufacturing process of an element. Among these substrates, a glass substrate or the like can easily be made to have 1 meter or more on a side, in addition, the shape can be made to a desired shape such as quadrangle or round shape. Thus, for example, if a substrate having 1 meter or more on a side is used, productivity can be improved significantly. Such a characteristic is a great advantage as compared to a case of obtaining IC chips from a circular Si substrate.

Figure 1B:
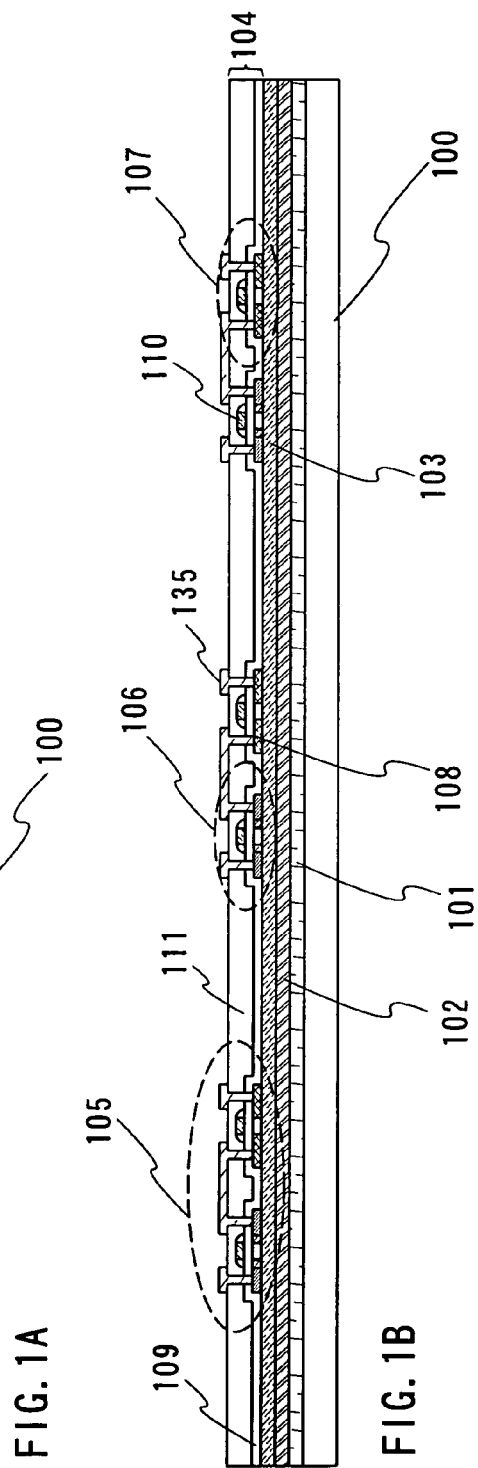
Figure 1C:
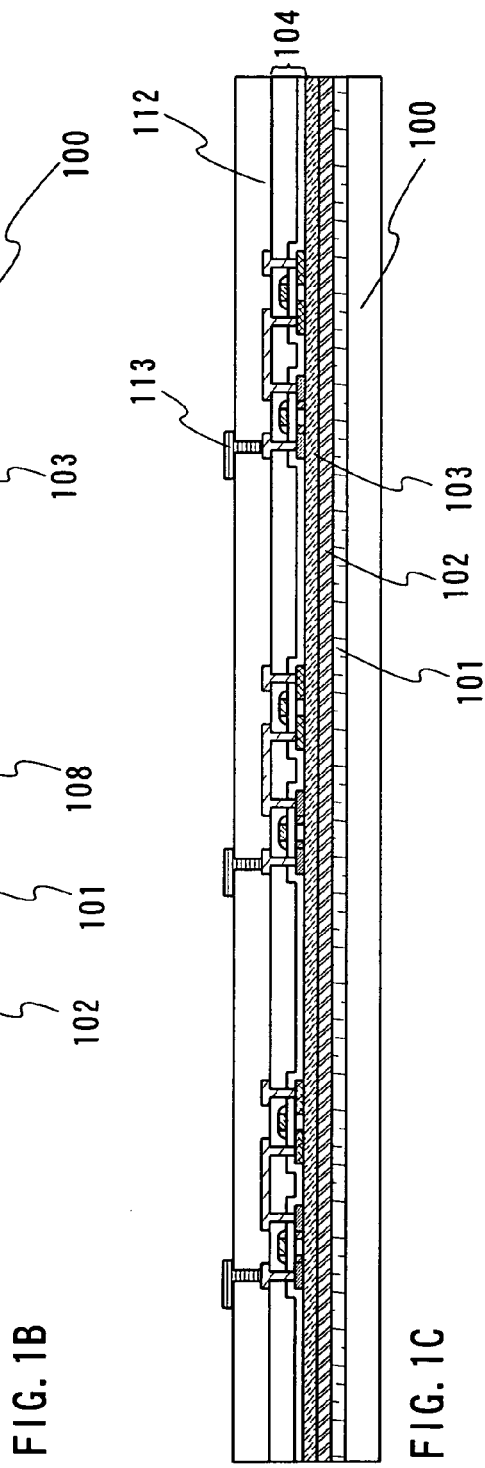

Next, a layer 104 including an element is formed over the layer for improving adhesion (buffer layer) 103 (see FIG. 1B). For example, this layer may have a wire, capacity, an inductor (antenna) or the like and the combination thereof instead of a unit circuit such as a TFT circuit. In this particular example, a TFT circuit 105 is formed in the layer 104 including an element. In this figure, the TFT circuit 105 has an N-channel transistor 106 and a P-channel transistor 107. Each of the N-channel transistor 106 and the P-channel transistor 107 has a semiconductor film 108, a gate insulating film 109, a gate electrode 110, an interlayer insulating film 111, and a source or drain electrode 135.

In this example, the TFT circuit 105 includes at least a plurality of insulating films and a semiconductor film and a conductive film composing a plurality of elements. Specifically, the TFT circuit 105 includes a plurality of elements (in this case, the N-channel transistor 106 and the P-channel transistor 107), an interlayer insulating film 111 covering a plurarity of elements, and a first conductive layer 135 (source or drain electrode) which contacts the interlayer insulating film 111 and is connected to a plurality of elements.

In this example, a terminal for external connection is formed and an integrated circuit which can be combined with other substrate is formed. Therefore, an insulating film 112 is formed over the layer 104 including an element, and an opening portion is formed in the insulating film 112. Next, an electrode 113 enabling contact with the TFT circuit 105 is formed (see FIG. 1C).

An example of a manufacturing method of the layer 104 including an element is described in detail, hereinafter.

First, an amorphous semiconductor film is formed over the layer for improving adhesion 103. The amorphous semiconductor film is formed by sputtering or various types of CVD such as plasma CVD. Subsequently, the amorphous semiconductor film is crystallized to form a crystalline semiconductor film. As a crystallization method, laser crystallization, thermal crystallization using RTA or an annealing furnace, thermal crystallization using a metal element for promoting crystallization, thermal crystallization using a metal element for promoting crystallization with laser crystallization, or the like can be used. Thereafter, the thus obtained crystalline semiconductor film is patterned into a desired shape to form crystalline semiconductor film 108.

An example of steps of manufacturing the crystalline semiconductor films will be briefly described below. As a method for crystallizing the amorphous semiconductor films, laser crystallization, thermal crystallization using RTA or an annealing furnace, thermal crystallization using a metal element for promoting crystallization, thermal crystallization using a metal element for promoting crystallization with laser crystallization, or the like can be given. Further, as other crystallization method, crystallization may be performed by generating thermal plasma by applying DC bias and making the thermal plasma affect a semiconductor film.

When employing laser crystallization, a continuous wave laser beam (CW laser beam) or a pulsed laser beam (pulse laser beam) can be used. As a usable laser beam, a beam emitted from one or plural kinds of a gas laser such as an Ar laser, a Kr laser, or an excimer laser; a laser using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser, can be used. An object is irradiated with a laser beam having a fundamental wave of such lasers or a second to a fourth harmonic of a fundamental wave to obtain a crystal with a large grain size. For instance, the second harmonic (532 nm) or the third harmonic (355 nm) of an Nd: YVO$_4$ laser (fundamental wave of 1,064 nm) can be used. In this case, the power density of about 0.01 to 100 MW/cm$^2$ (preferably, 0.1 to 10 MW/cm$^2$) is required for a laser. The scanning rate is approximately set to be about 10 to 2,000 cm/sec to irradiate the semiconductor film.

Note that each laser using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; and a Ti: sapphire laser, can continuously oscillate. Further, pulse oscillation thereof can be performed with an oscillation frequency of 10 MHz or more by carrying out Q switch operation or mode synchronization. When a laser beam is oscillated with an oscillation frequency of 10 MHz or more, a semiconductor film is irradiated with a next pulse during a period where the semiconductor film is melted by the laser beam and then is solidified. Therefore, differing from a case of using a pulse laser with a low oscillation frequency, a solid-liquid interface can be continuously moved in the semiconductor film so that crystal grains, which continuously grow toward a scanning direction, can be obtained.

When the amorphous semiconductor film is crystallized by using a continuous wave laser or a laser beam which oscillates at a frequency of 10 MHz or more as described above, a surface of the crystallized semiconductor film can be planarized. As a result, a gate insulating film 109, which will be formed later, can be formed thinly. In addition, this contributes to improve pressure resistance of the gate insulating film 109.

When ceramic (polycrystal) is used as a medium, the medium can be formed to have a free shape for a short time at low cost. When using a single crystal, a columnar medium with several mm in diameter and several tens of mm in length is usually used. In the case of using the ceramic, a medium bigger than the case of using the single crystal can be formed.

A concentration of a dopant such as Nd or Yb in a medium, which directly contributes to light emission, cannot be changed largely in both cases of the single crystal and the polycrystal, and therefore, there is a limitation in improvement in output of a laser by increasing the concentration of the dopant to some extent. However, in the case of the ceramic, the size of a medium can be significantly increased as compared with the case of the single crystal, and therefore, drastic improvement in output of a laser can be expected.

Further, in the case of the ceramic, a medium with a parallelepiped shape or a rectangular parallelepiped shape can be easily formed. In a case of using a medium having such a shape, when oscillated light is made travel in a zig-zag manner inside the medium, a path of the oscillated light can be made long. Therefore, amplitude is increased and a laser beam can be oscillated at high output. Furthermore, a cross section of a laser beam emitted from a medium having such a shape has a quadrangular shape, and therefore, as compared with a laser beam with a circular shape, the laser beam with the quadrangular shape in cross section have an advantage to be shaped into a linear beam. By shaping a laser beam emitted in the above described manner using an optical system, a linear beam with 1 mm or less in length of a short side and several mm to several m in length of a long side can be easily obtained. In addition, when a medium is uniformly irradiated with excited light, a linear beam is emitted with a uniform energy distribution in a long side direction.

When a semiconductor film is irradiated with this linear beam, the semiconductor film can be uniformly annealed. In a case where uniform annealing is required from one end to the other end of the linear beam, an ingenuity in which slits are provided in both ends of the linear beam so as to shield an attenuated portion of energy from light, or the like may be performed.

When a semiconductor film is annealed by using the thus obtained linear beam with uniform intensity and a semiconductor device is manufactured by using this semiconductor film, a characteristic of the semiconductor device can be made favorable and uniform.

As thermal crystallization using a metal element for promoting crystallization, an example of a specific method will be given. After keeping a solution containing nickel, which is a metal element for promoting crystallization, over an amorphous semiconductor film, the amorphous semiconductor film is subjected to dehydrogenation treatment (500° C. for one hour) and thermal crystallization treatment (550° C. for four hours) so as to form a crystalline semiconductor film. Thereafter, the crystalline semiconductor film is irradiated with a laser beam if required, and then, the crystalline semiconductor film is patterned by photolithography to form the crystalline semiconductor film 108.

The thermal crystallization using a metal element for promoting crystallization has advantages of being capable of crystallizing an amorphous semiconductor film at a low temperature for a short time and aligning a direction of crystals; however, the thermal crystallization has drawbacks that off current is increased due to a remnant of the metal element in the crystalline semiconductor film and characteristics of the crystalline semiconductor film are not stabilized. Therefore, it is preferable to form an amorphous semiconductor film serving as a gettering site over the crystalline semiconductor film. Since the amorphous semiconductor film, which becomes the gettering site, is necessary to contain an impurity element such as phosphorus or argon, the amorphous semiconductor film is preferably formed by sputtering by which the amorphous semiconductor film can contain argon at a high concentration. Thereafter, heat treatment (RTA, thermal annealing using an annealing furnace, or the like) is performed to disperse a metal element in the amorphous semiconductor film. Subsequently, the amorphous semiconductor film containing the metal element is removed. By carrying out such the gettering process, the amount of the metal element contained in the crystalline semiconductor film can be reduced or the metal element can be removed.

Next, a gate insulating film 109 is formed to cover the crystalline semiconductor film 108. The gate insulating film 109 is formed by using a single layer or a stacked layer containing silicon oxide or silicon nitride by sputtering or various types of CVD such as plasma CVD. Specifically, the gate insulating film 109 is formed by using a single layer of a film containing silicon oxide, a film containing silicon oxynitride, or a film containing silicon nitride oxide, or by appropriately stacking these films. Alternatively, the semiconductor film 108 may be subjected to the above described high-density plasma treatment under an atmosphere containing oxygen, nitrogen, or both of oxygen and nitrogen to oxidize or nitride each surface of the semiconductor film 108 so as to form the gate insulating film. The gate insulating film formed by the high-density plasma treatment has superior uniformity in film thickness and film quality as compared with a film formed by CVD or sputtering. In addition, a dense film can be formed as the gate insulating film by the high-density plasma treatment. As an atmosphere containing oxygen, a mixed gas of oxygen ($O_2$), nitrogen dioxide ($NO_2$) or dinitrogen monoxide ($N_2O$), and a rare gas; or a mixed gas of oxygen ($O_2$), nitrogen dioxide ($NO_2$) or dinitrogen monoxide ($N_2O$), a rare gas, and hydrogen ($H_2$); can be used. Further, as an atmosphere containing nitrogen, a mixed gas of nitrogen ($N_2$) or ammonia ($NH_3$) and a rare gas; or a mixed gas of nitrogen ($N_2$) or ammonia ($NH_3$), a rare gas, and hydrogen ($H_2$); can be used. Each surface of the semiconductor film 108 can be oxidized or nitrided by oxygen radical (which contains OH radical in some cases) or nitrogen radical (which contains NH radical in some cases) generated by high-density plasma.

When the gate insulating film 109 is formed by the high-density plasma treatment, an insulating film with a thickness of 1 to 20 nm, and typically, 5 to 10 nm, is formed over the semiconductor film 108. A reaction in this case is a solid-phase reaction, and therefore, interface state density between the insulating film and the semiconductor film 108 can be extremely reduced. Further, since the semiconductor film 108 can be directly oxidized or nitrided, variations in thickness of the gate insulating film 109 to be suppressed significantly and ideally. Furthermore, since strong oxidation is not generated in a crystal grain boundary of crystalline silicon, an extremely preferable state is made. That is, when each surface of the crystalline semiconductor films is subjected to solid-phase oxidation by the high-density plasma treatment shown here, an insulating film with low interface state density and good uniformity can be formed without generating abnormal oxidation reaction in a crystal grain boundary.

Note that, as the gate insulating film 109, only an insulating film formed through the high-density plasma treatment may be used. Alternatively, the insulating film formed through the high-density plasma treatment and another insulating film formed using silicon oxide, silicon nitride containing oxygen, or silicon oxide containing nitrogen by CVD utilizing plasma or a thermal reaction may be stacked to form the gate insulating film. In FIG. 1B, the structure that a laminated insulating film by CVD is had as well as the insulating film formed by high-density plasma treatment. In either case, when a transistor is formed to have a gate insulating film which partly or entirely includes an insulating film formed by high-density plasma, variations in characteristics can be reduced.

Further, the crystalline semiconductor films formed by crystallizing the amorphous semiconductor film by irradiation of a continuous wave laser beam or a laser beam oscillated at a frequency of 10 MHz or more while scanning the amorphous semiconductor film with the laser beam in one direction, have a characteristic that crystals grow in a scanning direction of the laser beam. Therefore, when a transistor is disposed such that the scanning direction corresponds to a channel length direction (a direction of flowing carries when a channel formation region is formed), and the gate insulating film 109 formed by the high-density plasma treatment is combined with the transistor, a transistor with less variations in characteristics and high electron field-effect mobility can be obtained.

Next, the gate electrode 110 is formed over the gate insulating film 109. The gate electrode 110 may be formed by sputtering or various types of CVD such as plasma CVD. In addition, the gate electrode 110 can be formed by using an element selected from tantalum (Ta), tungsten (W), titanium (Ti), molybdenum (Mo), aluminum (Al), copper (Cu), chromium (Cr), niobium (Nb), and the like; or an alloy material or a compound material mainly containing these elements. Further, the gate electrode 110 can be formed by using a semiconductor material typified by polycrystalline silicon doped with an impurity element such as phosphorus.

Next, impurity elements are selectively added to the semiconductor film 108 by ion doping or ion implantation to form N-channel transistor 106 and P-channel transistor 107. Note that in FIG. 1B, an LDD region (a low concentration impurity region) is formed using an insulating film (a sidewall) in contact with a side surface of each gate electrode 110 in each of the N-channel transistor 106. As an impurity element imparting N-type used for forming the N-channel transistors 106, an element belonging to Group 15 of the periodic table may be used, and for example, phosphorus (P) or arsenic (As) is used. Further, as an impurity element imparting P-type used for forming the P-channel thin film transistor 107, an element belonging to Group 13 may be used, and for example, boron (B) is used.

After completing the N-channel transistor 106 and the P-type transistor 107 through the above described steps, heat treatment for recovering crystallinity of the semiconductor films or activating the impurity elements added to the semiconductor films, may be performed. Further, after performing the heat treatment, the exposed gate insulating film 109 may be subjected to high-density plasma treatment under an atmosphere containing hydrogen so that a surface of the gate insulating film 109 may contain hydrogen. This is because the hydrogen can be utilized when performing a step of hydrogenating the semiconductor films later. Further, by performing high-density plasma treatment under an atmosphere containing hydrogen while heating the substrate at 350 to 450° C., hydrogenation of the semiconductor films can be performed. Further, as the atmosphere containing hydrogen, a mixed gas of hydrogen ($H_2$) or ammonia ($NH_3$) and a rare gas (for example, argon (Ar)) can be used. When a mixed gas of ammonia ($NH_3$) and a rare gas (for example, argon (Ar)) is used as the atmosphere containing hydrogen, the surface of the gate insulating film 109 can be hydrogenated and nitrided at the same time.

Then, the interlayer insulating film 111 is formed to cover the plurality of transistors. The interlayer insulating film 111 is formed using a single layer or a stacked layer made from an inorganic material such as silicon oxide or silicon nitride; an organic material such as polyimide, polyamide, benzocyclobutene, acrylic, or epoxy; siloxane; or the like, by an SOG technique, a droplet discharing method, or the like. In this specification, siloxane has a skeleton structure including silicon (Si)-oxygen (O) bonds and an organic group containing at least hydrogen (for example, an alkyl group, aromatic hydrocarbon, or the like) is used as a substituent. Further, as the substituent, a fluoro group may be used, or both of an organic group containing at least hydrogen and a fluoro group may be used. For example, in a case where the interlayer insulating film 111 has a three layer structure, a film mainly containing silicon oxide may be formed as a first insulating film, a film mainly containing a resin may be formed as a second insulating film, and a film mainly containing silicon nitride may be formed as a third insulating film. Further, in a case where the interlayer insulating film 111 has a single layer structure, a silicon nitride film or a silicon nitride film containing oxygen may be formed. In this case, it is preferable that by performing high-density plasma treatment under an atmosphere containing hydrogen with respect to the silicon nitride film or the silicon nitride film containing oxygen, hydrogen be contained in a surface of the silicon nitride film or the silicon nitride film containing oxygen. This is because when performing a hydrogenation step of the semiconductor film 108 later, this hydrogen can be utilized. Further, by performing high-density plasma treatment under an atmosphere containing hydrogen while heating the substrate at 350 to 450° C., hydrogenation of the semiconductor films can be performed. Note that, as the atmosphere containing hydrogen, a mixed gas of hydrogen ($H_2$) or ammonia ($NH_3$) and a rare gas (for example, argon (Ar)) can be used. When a mixed gas of ammonia ($NH_3$) and a rare gas (for example, argon (Ar)) is used as the atmosphere containing hydrogen, the surface of the gate insulating film 109 can be hydrogenated and nitrided at the same time.

Note that, prior to forming the interlayer insulating film 111, heat treatment for recovering crystallinity of the semiconductor films, activating the impurity elements added to the semiconductor films, or hydrogenating the semiconductor films, is preferably performed. The heat treatment preferably employs thermal annealing, laser annealing, RTA, or the like. For example, in order to activate the impurity elements, thermal annealing at 500° C. or more is preferably performed. Further, in order to hydrogenate the semiconductor films, thermal annealing at 350 to 450° C. may be performed.

Next, the interlayer insulating film 111 and the gate insulating film 109 are etched by photolithography to form contact holes through which the semiconductor film 108 are exposed. Subsequently, a conductive film is formed to fill the contact holes. The conductive film is patterned to form source or drain electrodes 135.

The source or drain electrodes 135 are formed by using a conductive film mainly containing aluminum (Al) by sputtering, various types of CVD such as plasma CVD, or the like. The conductive film mainly containing aluminum (Al) corresponds to a material mainly containing aluminum, which also contains nickel, or an alloy material mainly containing aluminum, which also contains nickel and one or both of carbon and silicon, for example. Since the conductive film mainly containing aluminum generally has a drawback of a poor heat resistance property, an upper surface and a lower surface of the conductive film mainly containing aluminum are preferably covered with barrier films. The barrier films indicate films having a function of suppressing heroic of the conductive film mainly containing aluminum or improving a heat resistance property. As a material having such a function, chromium, tantalum, tungsten, molybdenum, titanium, silicon, and nickel, or nitride of these elements can be given. As an example of a structure of each of the source or drain electrodes 135, a structure in which a titanium film, an aluminum film, and another titanium film are sequentially stacked from a substrate side, can be given. Since titanium is an element having a high reducing property, even when a thin oxide film is naturally formed on the crystalline semiconductor film, the oxide film naturally formed can be reduced by the titanium so that the titanium film can be well-contacted to the crystalline semiconductor film. Further, the titanium film formed between the crystalline semiconductor film and the aluminum film, is preferably subjected to high-density plasma treatment under an atmosphere containing nitrogen to nitride a surface of the titanium film. In a condition of the high-density plasma treatment, electron density of plasma is $1 \times 10^{11}$ cm$^{-3}$ or more and $1 \times 10^{13}$ cm$^{-3}$ or less, and an electron temperature of plasma is 0.5 eV or more and 1.5 eV or less. As the atmosphere containing nitrogen, a mixed gas of $N_2$ or $NH_3$ and a rare gas, or a mixed gas of $N_2$ or $NH_3$, a rare gas, and $H_2$ can be used. Nitriding the surface of the titanium film makes it possible to prevent alloying of titanium and aluminum and prevent aluminum from dispersing in the crystalline semiconductor film through the titanium film in a step of heat treatment or the like, which will be performed later. Note that an example of sandwiching the aluminum film with the titanium films is described here, and this is the same for a case of using chromium films, tungsten films, or the like instead of the titanium films. More preferably, formation of the titanium film, nitriding treatment of the surface of the titanium film, formation of the aluminum film, and formation of another titanium film are successively carried out by using a multi-chamber apparatus without exposing these films to atmospheric air.

According to the above described steps, the layer 104 including an element is formed.

Next, a second substrate 115 is bonded over the insulating film 112 and the electrode 113 by using a first adhesive 114 (see FIG. 2A). The second substrate 115 is a substrate for keeping flatness of the layer 104 including an element and for protecting flatness of the layer 104 including an element. Adhesion of the first adhesive 114 is strong in a nomal state, and it is preferable that the first adhesive 114 has a property such that the adhesion becomes weak by light irradiation or heating. Specifically, a UV peelable adhesive of which adhesion becomes weak by irradiation with ultraviolet radiation, or a heat peelable adhesive of which adhesion becomes weak by heating may be used. In this example, a UV peelable adhesive is used as the first adhesive 114.

In this example, the second substrate 115 is composed of only a substrate; however, an element or a plurality of elements may be formed over the second substrate 115. An element corresponds to a thin film transistor, a capacitor element, a resistance element, an inductor, a diode, or the like.

In grinding, polishing, or the like, an elastic substrate (for example, an expand film, or the like) is further bonded over the second substrate 115, and a space between separated substrates is made wider by expanding the elastic substrate after separating the second substrate 115, and the substrate can be handled easily. Accordingly, such a method can be employed. Since an object of this example is to make the first substrate thinner by using flatness of the second substrate; therefore, such a method is not used.

Next, a surface opposite to one surface (a surface over which the TFT circuit 105 is formed) of the first substrate 100 is ground or polished by a grinding means or a polishing means 116 (see FIG. 2B). In this example, grinding is performed until the thickness of the first substrate 100 becomes 100 μm or less. Then, polishing is performed until the thickness of the first substrate 100 becomes 20 μm or less. At this time, grinding and polishing may be performed until the first substrate 100 almost disappears.

Here, for example, there is silicon, glass, quartz, or the like as a material used as a substrate. Vickers hardness of silicon is about 1000 kg/mm$^2$, and Vickers hardness of glass, quartz, or the like is about 600 to 900 kg/mm$^2$. In addition, as abrasive grains used in a polishing process, cerium oxide ($CeO_2$) is used when a glass substrate is polished, silicon oxide ($SiO_2$) is used when a silicon wafer is polished, alumina ($Al_2O_3$) is used when a metal substrate is polished. Vickers hardness of alumina ($Al_2O_3$) is about 2200 kg/mm$^2$, Vickers hardness of silicon is about 1000 kg/mm$^2$, Vickers hardness of silicon oxide ($SiO_2$) or the like is about 600 to 900 kg/mm$^2$, and Vickers hardness of cerium oxide ($CeO_2$) is lower than that of glass. Meanwhile, Vickers hardness of diamond like carbon is about 2500 to 4000 kg/mm$^2$, which is higher than a material used as a substrate. Therefore, a layer formed over the diamond like carbon layer can be prevented from ground or polished by forming the DLC layer 102 between the first substrate 100 and the layer 104 including an element. In addition, since DLC has not only high hardness but also good surface flatness and a lower coefficient of friction, it serves as a high functionality stopper layer. Note that, here, hardness is compared using Vickers hardness; however, the hardness is sometimes may be shown in a method other than Vickers hardness (Brinell hardness, Rockwell hardness, Knoop hardness, or the like).

Here, an example in which the first substrate 100 is ground until the thickness becomes 100 μm or less, and then, the first substrate 100 is polished until the thickness becomes 20 μm or less is shown; however, grinding or polishing may be at least until the thickness of the first substrate 100 becomes thin to be easily separated. If the substrate is made thinner than before, the thickness should be 100 μm or less. Since the substrate becomes strong against bending when the thickness becomes 20 μm or less, the substrate can be made not only thin but also flexible (an advantage which can be assumed a thing having flexibility), which is preferable. In a case of using an insulating substrate, since an advantage of thinning is significant when the thickness of the substrate is 10 μm or less where dependency of variations in the thickness is considerable in a semiconductor substrate or a conductive substrate, it is more preferable. In the semiconductor substrate or the conductive substrate, it is preferable to remove the substrate completely; however, when an element is formed in the substrate, the thickness of the substrate is in the range of 10 to 100 μm.

In this grinding process, the surface of the first substrate 100 is ground or polished by rotating one or both of a stage over which the first substrate is fixed and the grinding means or the polishing means 116. At this time, not only the first substrate 100 but also the second substrate 115 may be ground or polished at the same time. This example shows a case where only the first substrate 100 is ground or polished.

The grinding means or the polishing means 116 is, for example, a grinding stone used for grinding or loose abrasive process grain treatment used for polishing. Thereafter, cleaning may be performed as necessary in order to remove dust generated by a grinding or a polishing process.

After this process is finished, the first substrate 100 may be removed entirely (see FIG. 2C). FIG. 2C shows a case that the first substrate 100 is removed entirely.

In addition, when the first substrate is thinned by using a grinding means or a polishing means, the first substrate 100 may be peeled off from the layer for improving adhesion (buffer layer) 101 to be removed by shock and vibration of grinding or polishing. Controlling of the adhesion is described in detail in Embodiment Mode 3.

In this example, the electrode 113 electrically connected with the TFT circuit 105 is formed on the second substrate 115 side. In addition, the electrode can be electrically connected with the TFT circuit 105 on the first substrate 100 side, and mounted on another substrate (for example, a substrate on which an antenna is formed, or the like). In this case, the third substrate below may not necessarily be provided.

A method for forming an electrode electrically connected with the TFT circuit 105 on the first substrate 100 side, in other words, a surface over which the DLC layer 102 is formed is as follows.

When the first substrate 100 remains, the first substrate 100, the layer which mainly contains DLC (the layer for improving adhesion (buffer layer) 101, the DLC layer 102, and the layer for improving adhesion (buffer layer) 103), the gate insulating film 109, the interlayer insulating film 111, and an opening is formed in the insulating film 112 by using UV laser, and a contact hole which reaches the electrode 113 is formed. An electrode for making a contact through this contact hole is formed. A mounting process follows after that. After mounting, the second substrate 115 is peeled off.

When the first substrate 100 is removed completely, the first substrate 100, the layer which mainly contains DLC (the layer for improving adhesion (buffer layer) 101, the DLC layer 102, and the layer for improving adhesion (buffer layer) 103), the gate insulating film 109, the interlayer insulating film 111, and an opening is formed in the insulating film 112 by using UV laser, and a contact hole which reaches the electrode 113 is formed. An electrode to take a contact through this contact hole is formed. A mounting process follows after that. After mounting, the second substrate 115 is peeled off.

In this example, the integrated circuit is mounted on the second substrate 115 side. If the second substrate 115 is peeled off here, the layer 104 including an element is curled by stress, and a problem occurs in the later mounting or handling. A third substrate 117 is bonded from the side opposite to the second substrate 115 by using the second adhesive 148 in order to prevent the above problem. In other words, when the first substrate 100 remains, the third substrate 117 is bonded to the first substrate 100 by using the second adhesive 148. When the first substrate 100 is removed, and the layer for improving adhesion (buffer layer) 101 is exposed in a surface, the third substrate 117 is bonded to the layer for improving adhesion (buffer layer) 101 by using the second adhesive 148. When the first substrate 100 and the layer for improving adhesion (buffer layer) 101 are removed and the DLC layer 102 is exposed in a surface, the third substrate 117 is bonded to the DLC layer 102 by using the second adhesive 148 (see FIG. 3A). In this example, the third substrate 117 is bonded to the layer for improving adhesion (buffer layer) 101. The third substrate 117 make it easier to keep strength after removing the second substrate 115, handling, or mounting, and the third substrate 117 is used for protecting the layer 104 including an element.

Adhesion of the second adhesive 148 is strong with nomal state, and it is preferable that the first adhesive 114 has a property such that the adhesion becomes weak by light irradiation or heating. Specifically, a UV peelable adhesive of which the adhesion becomes weak by irradiation with ultraviolet radiation, or a heat peelable adhesive of which the adhesion becomes weak by heating may be used. In addition, an adhesive of which the adhesion becomes weak by a mechanism (heat peeling, UV peeling), temperature, wave length, or light irradiating direction which is different from the first adhesive 114 is preferable as the second adhesive 148, and the combination which can peel off the second substrate which is bonded with the third substrate is used. In this example, an adhesive having a heat peeling property is used.

Here, a laminated body having the insulating film 112, the layer 104 including an element, and the layer which mainly contains DLC (the layer for improving adhesion (buffer layer) 101, the DLC layer 102, and the layer for improving adhesion (buffer layer) 103) may be separated so as to be asigned to every TFT circuit 105 formed in the layer 104 including an element from the second substrate 115 side. Alternatively, the third substrate is also divided, and then each of TFT circuits 105 formed in the layer including an element 104 may be completely divided. In this example, dividing is not performed at this time. First, the process of removing the second substrate is performed.

Figure 3A:
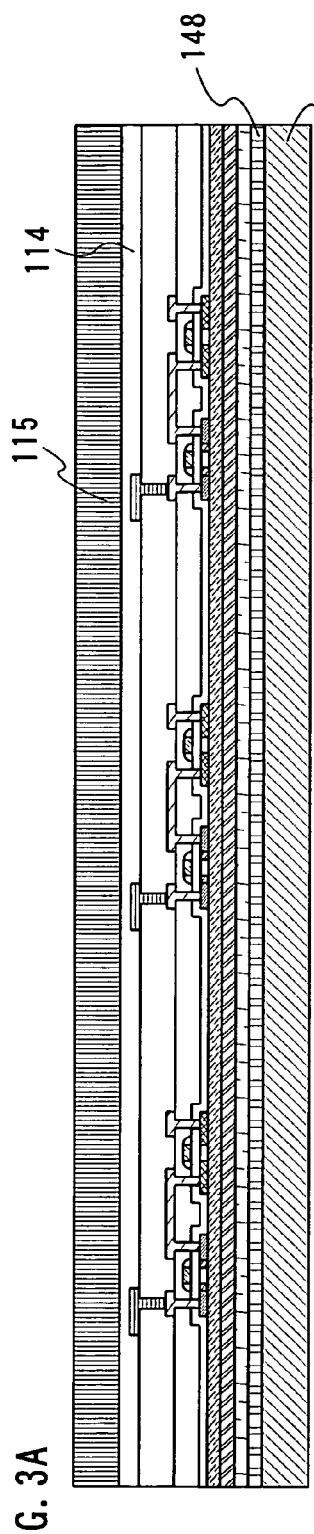
FIGS. 3A to 3C are diagrams describing Embodiment Mode 1.
Figure 3B:
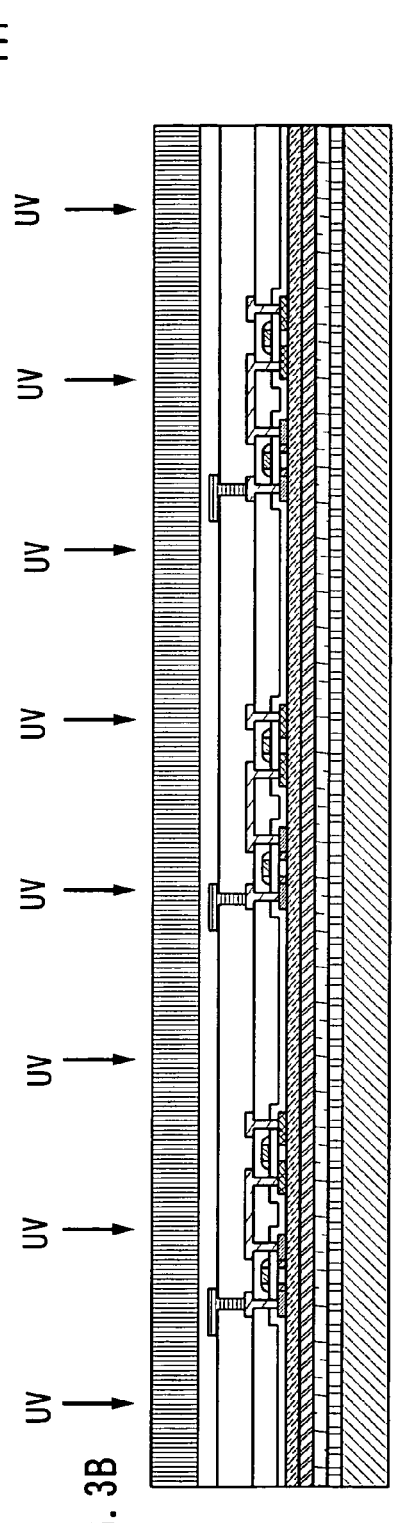
Figure 3C:
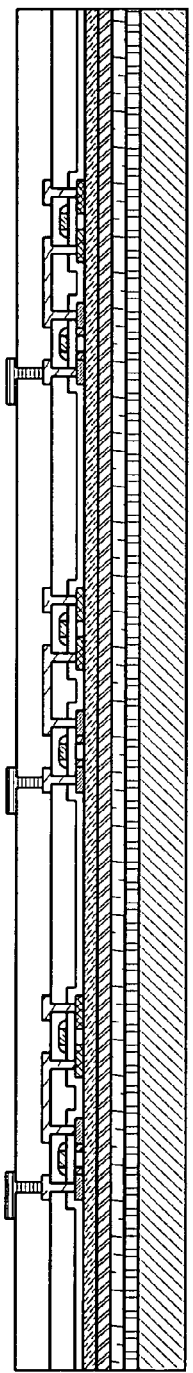

Subsequently, a process for reducing adhesion of the first adhesive 114 is performed (see FIG. 3B). In this case, UV irradiation is conducted. In a case of a combination of the first substrate to the third substrate in which UV radiation does not reach an adhesive even if UV radiation is applied from either a top surface or a bottom surface (if the first substrate is removed, it is a combination of the second substrate and the third substrate), UV radiation is applied from a side surface, and the adhesive is peeled off. If only the third substrate 117 does not transmit UV radiation, first, UV radiation is applied from the side of the first substrate 100 to weaken adhesion, and then the third substrate is bonded. If the first adhesive 114 has a heat peeling property, heating is performed in such a way that the third substrate does not peel off. If the third substrate is not removed after mouting, any adhesive can be used as the second adhesive.

Consequently, adhesion of the first adhesive 114 becomes weak, a laminated body having the insulating film 112, the layer 104 including an element, the layer which mainly contains DLC (the layer for improving adhesion (buffer layer) 101, the DLC layer 102, and the layer for improving adhesion (buffer layer) 103), the second adhesive 148, and the third substrate 117 (the first substrate 100 may be included) can be separated from the second substrate 115 by a physical means. Then, the second substrate 115 is removed (see FIG. 3C).

Subsequently, a laminated body having the insulating film 112, the layer 104 including an element, the layer which mainly contains DLC (the layer for improving adhesion (buffer layer) 101, the DLC layer 102, and the layer for improving adhesion (buffer layer) 103), the second adhesive 148, and the third substrate 117 (the first substrate 100 may be included) is cut by a cutting means (see FIG. 4A). In this case, the laminated body is cut to be separated for every TFT circuit 105 formed in the layer 104 including an element. FIG. 4A shows an example of cutting using a laser as a cutting means. Note that a cutting means corresponds to a laser, a dicer, a wire saw, or a scriber.

After a cutting process, a plurality of integrated circuit devices 118 to 120 which have structures shown in FIG. 4B are formed (see FIG. 4B). Since the electrodes 113 are exposed in the integrated circuit devices 118 to 120, the integrated circuit devices 118 to 120 can be connected electrically with an external portion by the electrodes 113.

Then, the integrated circuit devices 118 to 120 are mounted over other substrates severally. In this example, a semiconductor device which can transmit and receive data without contact (it is referred to as an RFID (Radio Frequency Identification), an ID tag, an IC tag, an IC chip, an RF (Radio Frequency) tag, a wireless tag, an electronic tag, or a wireless chip) is assumed, and the integrated circuit device manufactured in the above process is mounted on a substrate provided with an antenna (see. FIG. 5A). A conductive pattern 123 which functions as an antenna is formed on a forth substrate 122. In this example, an anisotropic conductive paste (ACP) is used to a connecting portion. The TFT circuit 105 and the conductive pattern 123 which functions as an antenna are electrically connected through via conductive particles, and the integrated circuit device is bonded to the antenna with an adhesive resin paste 124. In addition, a method of an anisotropic conductive film (ACF), a non-conductive paste (NCP), solder, or the like may be used for the mounting.

In this example, an integrated circuit device is mounted over the forth substrate 122 provided with an antenna; however, the integrated circuit device of the present invention may be mounted over a substrate provided with an element or a plurality of elements instead of an antenna. An element corresponds to a thin film transistor, a capacitor element, a resistance element, an inductor, or a diode.

At this time, mounting can be performed stably, and the layer 104 including an element and the electrode 113 can be protected from a physical breakage by existing the third substrate 117.

In this example, the third substrate 117 is removed afterwards. If the second adhesive 148 has a heat peeling property, the third substrate 117 is removed by heat treatment (see FIG. 5A). FIG 5B shows a state in which the third substrate 117 is removed. In FIG 5A, the third substrate 117 is removed; however, it may be finished without removing it.

Thereafter, sealing of one surface of a film is performed by using a first film 127 in order to improve a water-resistant barrier property, chemical resistance, salt water resistance, scratch resistance, or the like (see FIGS. 6A and 24B). The first film 127 has an adhesive layer 132 in the surface. FIGS. 6A and 6B show the case where the first film 127 is sealed after removing the third substrate, and FIGS. 24A and 24B show the case where the first film 127 is sealed without removing the third substrate. There is a case where a process is finished as this shape, or an RFID is attached with an adhesive like a sticker.

FIGS. 6A and 24A show film sealing on one surface; however, both surfaces may be sealed by using a first film 130 and a second film 128 as shown in FIGS. 6B and 24B. Sealing of both surfaces may be performed for each surface separately or by sealing both surfaces at the same time. An adhesive layers 131 and 129 are formed on the surfaces of a first film 130 and a second film 128 respectively.

In a semiconductor device which is completed through the above process (in this case, an RFID), the thickness is thin, and lightweight. In addition, since the semiconductor device is thin, if the semiconductor device (RFID) is mounted on goods, the design property is not degraded. Further, the semiconductor device (RFID) can be bonded to any kind of curved surface along the curve surface. For example, when the semidconductor device (RFID) is put through a copying machine or the like, a chip or a chip connection portion is not damaged, and when the semiconductor device (RFID) is mounted on a pen, a circular shape of a pen can be kept.

A plurality of integrated circuit devices are manufactured by a method explained in this embodiment mode, and bonding a plurality of integrated circuit devices merely with an adhesive repeatedly so that the plurality of integrated circuit devices are laminated, or bonding is repeated in a state in which electrical connection can be performed thereby laminating them. Thus, the integrated circuit device can have a laminated structure having two or more layers. Consequently, a multifunctional element can be formed in a small space. The elements which are included in each integrated circuit device may b operated in synchronization by electricity, magnetism, light, acoustics, vibration, or the like between the bonded integrate circuit devices.

In this embodiment mode described above, an example of forming a layer which mainly contains diamond like carbon is formed as a stopper layer is shown. When a DLC layer is used as a stopper layer as in this embodiment mode, heating conditions of an element formed over the DLC layer are not limited by heat resistance of diamond like carbon. However, a material used as a stopper layer is not limited to DLC. As long as a material used as a stopper layer has higher hardness than the first substrate 100, the material is not limited. For example, TiCN (titanium carbonitride), TiAlN (titanium aluminum nitride), or the like having high hardness can be used. In particular, since TiCN has not only high hardness but also low coefficient of friction, TiCN is suitable.

In addition, as a stopper layer, a material which has higher hardness and lower coefficient of friction than the first layer 100 is preferable.

Layers for improving adhesion (buffer layers) 101 and 103 are not limited to the materials given in this embodiment mode. The layer for improving adhesion (buffer layer) 101 may be formed with a material of which adhesion with a substrate is good, and adhesion with a stopper layer is good. In addition, the layer for improving adhesion (buffer layer) 103 may be formed with a material of which adhesion with a stopper layer is good, and adhesion with a layer including an element is good.

Embodiment Mode 2

This embodiment mode is described using FIGS. 7A to 10. In this embodiment mode, an example in which a layer which mainly contains diamond like carbon is formed over a substrate as a stopper layer in a case that a substrate is made thinly or removed by etching by chemical reaction is described.

A layer for improving adhesion (buffer layer) 201, a DLC layer 202, and a layer for improving adhesion (buffer layer) 203 are formed in order over one surface of a first substrate 200.

Next, a layer including an element 204 is formed over the layer for improving adhesion (buffer layer) 203 (see FIG. 7B). For example, this layer may have a wire, a capacitor, an inductor (antenna) or the like, and the combination thereof instead of a unit circuit such as a TFT circuit. In this particular example, a TFT circuit 205 is formed in the layer including an element 204. In this figure, the TFT circuit 205 has an N-channel transistor 206 and a P-channel transistor 207. Each of the N-channel transistor 206 and the P-channel transistor 207 has a semiconductor film 208, a gate insulating film 209, a gate electrode 210, an interlayer insulating film 211, and a source or drain electrode 235.

In this example, a terminal for external connection is formed and the TFT circuit 205 which can be combined with other substrate is formed. Therefore, an insulating film 212 is formed over the layer including an element 204, and an opening portion is formed in the insulating film 212. Next, an electrode 213 enabling contact with the TFT circuit 205 is formed (see FIG. 7C).

Next, a second substrate 215 is bonded over the insulating film 212 and the electrode 213 by using a first adhesive 214 (see FIG. 8A). The second substrate 215 is a substrate for keeping flatness of the layer including an element 204 and for protecting flatness of the layer including an element 204. Adhesion of the first adhesive 214 is strong in a nomal state, and it is preferable that the first adhesive 214 has a property such that the adhesion becomes weak by light irradiation or heating. Specifically, a UV peelable adhesive of which the adhesion becomes weak by irradiation with ultraviolet radiation, or a heat peelable adhesive of which the adhesion becomes weak by heating may be used. In this example, a UV peelable adhesive is used as the first adhesive 214.

In grinding, polishing, or the like, an elastic substrate (for example, an expand film, or the like) is further bonded over the second substrate 215, and a space between separated substrates is made wider by expanding the elastic substrate after separating the second substrate 215, and the substrate can be handled easily. Accordingly, such a method can be employed. Since an object of this example is to make the first substrate thinner by using flatness of the second substrate; therefore, such a method is not used.

The preceding process may be performed similarly to Embodiment Mode 1.

Next, an etchant resistant layer 216 is formed at least on a side portion of the first substrate to prevent that etching by chemical reaction performed in a later process reaching a region other than the first substrate (see FIG. 8A). An organic resin may be used as the etchant resistant layer. FIG. 8A shows a case where the etchant resisting layer 216 is formed on a side portion of laminated body having the first substrate, the layer for improving adhesion (buffer layer) 201, the DLC layer 202, the layer for improving adhesion (buffer layer) 203, the layer including an element 204, the insulating film 212, the first adhesive 214, and the second substrate 215. When the second substrate does not have resistance to etching by chemical reaction, the etchant resistant layer 216 is formed so as to cover not only the side portion but also the surface of the second substrate. The etchant resistant layer 216 is formed with a material having resistance to an etchant used for etching by chemical reaction in a later process.

A surface opposite to one surface of the first substrate 200 (a surface formed in the TFT circuit 205) is etched by chemical reaction (see FIG. 8B). At the minimum etching may be performed until the thickness is such that separation becomes easy; however, if the substrate is made thinner in comparison with before, the thickness is set at 100 µm or less. When the thickness becomes 20 µm or less, the substrate becomes able to withstand bending, so not only thinning but also an advantage of flexibility (an advantage of being able to assume a thing has flexibility) is expressed, so this is preferable. In a case where an insulating substrate is used, since an advantage of thinning is large when the thickness of the substrate is 10 µm or less, where dependency of variation in thickness becomes large is big in a semiconductor substrate or a conductive substrate, it is even more preferable. In the semiconductor substrate or the conductive substrate, it is preferable to etch until the first substrate 200 disappears completely; however, when an element is formed in the substrate, it is preferable that the thickness is in a range of 10 to 100 µm.

When the first substrate 200 is a glass substrate or a quartz substrate for example, HF or $ClF_3$ is used as an etchant. In addition, for example, when the first substrate 200 is an Si substrate, alkali such as TMAH (tetramethylammonium hydroxide) or halogen gas such as $ClF_3$ is used as an etchant. When a substrate is a metal substrate, acid or alkali is used. DLC has strong resistance to alkali, HF, and $ClF_3$. Therefore, even if etching is performed until the first substrate 200 disappears, further progress of the etching can be prevented by the existence of the layer for improving adhesion (buffer layer) 201, the DLC layer 202, and the layer for improving adhesion (buffer layer) 203.

It is known that amorphous carbon has weaker strength than DLC; however, it is known that it has strong resistance chemicals. Therefore, when etching by chemical reaction is used as a method to thin the first substrate, a layer mainly containing amorphous carbon may be formed instead of forming a layer mainly containing DLC when the layer for improving adhesion (buffer layer) 201, the DLC layer 202, and the layer for improving adhesion (buffer layer) 203 are formed. On that occasion, a Si concentration of the layer for improving adhesion (buffer layer) 201 and the layer for improving adhesion (buffer layer) 203 may be the range of 1 to 20%.

After this process is finished, the first substrate may be removed entirely. In this example, the first substrate is removed entirely.

Anyone of a liquid, gas, or plasma can be used as an etchant by chemical reaction. Cleaning is often performed as necessary, to prevent decay after etching.

In addition, after grinding or polishing as in Embodiment Mode 1, etching by chemical reaction is used, or after etching by chemical reaction, grinding or polishing is performed as in Embodiment Mode 1. The combination thereof may be freely used.

In this example, the electrode 213 electrically connected with the TFT circuit 205 is formed on the second substrate 215 side. In addition, the electrode can be electrically connected with the TFT circuit 205 on the first substrate 200 side, and mounted on another substrate (for example, a substrate on which formed an antenna is formed, or the like). In this case, the third substrate below may not necessarily be provided. A method for forming the electrode electrically connected with the TFr circuit 205 on the first substrate 200, in other words, a surface on which a DLC layer is existed may be performed similarly to Embodiment Mode 1.

In this example, the integrated circuit is mounted on the second substrate 215 side. If the second substrate 215 is peeled off here, the layer including an element 204 is curled by stress, and a problem occurs in the later mounting or handling. A third substrate 217 is bonded from the side opposite to the second substrate 215 by using a second adhesive 222 in order to prevent the above problem. In other words, when the first substrate 200 remains, the third substrate 217 is bonded to the first substrate 200 by using the second adhesive 222. When the first substrate 200 is removed, and the layer for improving adhesion (buffer layer) 201 is exposed in a surface, the third substrate 217 is bonded to the layer for improving adhesion (buffer layer) 201 by using the second adhesive 222. When the first substrate 200 and the layer for improving adhesion (buffer layer) 201 are removed and the DLC layer 202 is exposed in a surface, the third substrate 217 is bonded to the DLC layer 202 by using the second adhesive 222 (see FIG. 8C). In this example, since the first substrate 200 is removed in FIG. 8C, the third substrate 217 is bonded to the layer for improving adhesion (buffer layer) 201. The third substrate 217 make it easier to keep strength after removing the second substrate 215, handling, or mounting, and the third substrate 217 is used for protecting the layer including an element 204.

Adhesion of the second adhesive 222 is strong in a nomal state, and it is preferable that the first adhesive 214 has a property such that the adhesion becomes weak by light irradiation or heating. Specifically, a UV peelable adhesive of which the adhesion becomes weak by irradiation with ultraviolet radiation, or a heat peelable adhesive in which the adhesion becomes weak by heating may be used. In addition, an adhesive of which adhesion becomes weak by a mechanism (heat peeling, UV peeling), temperature, wave length, or light irradiating direction which is different from the first adhesive 214 is preferable as the second adhesive 222, and the combination which can peel off the second substrate which is bonded with the third substrate is used. In this example, an adhesive having a heat peelable property is used.

Here, a laminated body having the insulating film 112, the layer including an element 204, and the layer which mainly contains DLC (the layer for improving adhesion (buffer layer) 201, the DLC layer 202, and the layer for improving adhesion (buffer layer) 203) may be separated so as to be asigned to every TFT circuit 205 formed in the layer 204 including an element from the second substrate 215 side. Alternatively, the third substrate is also divided, and then each of TFT circuits 205 formed in the layer including an element 204 may be completely divided. In this example, dividing is not performed at this time. First, the process of removing the second substrate is performed.

Subsequently, a process for reducing adhesion of the first adhesive 214 is performed (see FIG. 9A). In this case, UV irradiation is conducted. In a case of a combination of the first substrate to the third substrate where UV radiation does not reach an adhesive even if UV radiation is applied from either a top surface or a bottom surface (if the first substrate is removed, it is a combination of the second substrate and the third substrate), UV radiation is applied from a side surface, and the adhesive is peeled off. If only the third substrate 217 does not transmit UV radiation, first, UV radiation is applied from the side of the first substrate 200 to weaken adhesion, and then the third substrate is bonded. If the first adhesive 214 has a heat peeling property, heating is performed in such a way that the third substrate does not peel off. If the third substrate is not removed after mouting, any adhesive can be used as the second adhesive.

Consequently, adhesion of the first adhesive 214 becomes weak, a laminated body having the insulating film 212, the layer including an element 204, the layer which mainly contains DLC (the layer for improving adhesion (buffer layer) 201, the DLC layer 202, and the layer for improving adhesion (buffer layer) 203), the second adhesive 222, and the third substrate 217 (the first substrate 200 may be included) can be separated from the second substrate 215 by a physical means. Then, the second substrate 215 can be removed. However, since an end portion of the second substrate 215 is fixed by the etchant resistant layer 216, at this point in the process, the second substrate 215 cannot be still removed.

Subsequently, a laminated body having the insulating film 212, the layer including an element 204, the layer which mainly contains DLC (the layer for improving adhesion (buffer layer) 201, the DLC layer 202, and the layer for improving adhesion (buffer layer) 203), the second adhesive 222, and the third substrate 217 (the first substrate 200 may be included) is cut by a cutting means (see FIG. 9B). In this case, the laminated body is cut to be separated for every TFT circuit 205 formed in the layer including an element 204. FIG. 9B shows an example of cutting using a laser as a cutting means. Note that a cutting means corresponds to a laser, a dicer, a wire saw, or a scriber. Since the end portion of the second substrate 215 fixed by the etchant resistant layer 216 is separated by the above process as shown in FIG. 9B, the second substrate 215 can be removed.

Figure 10:
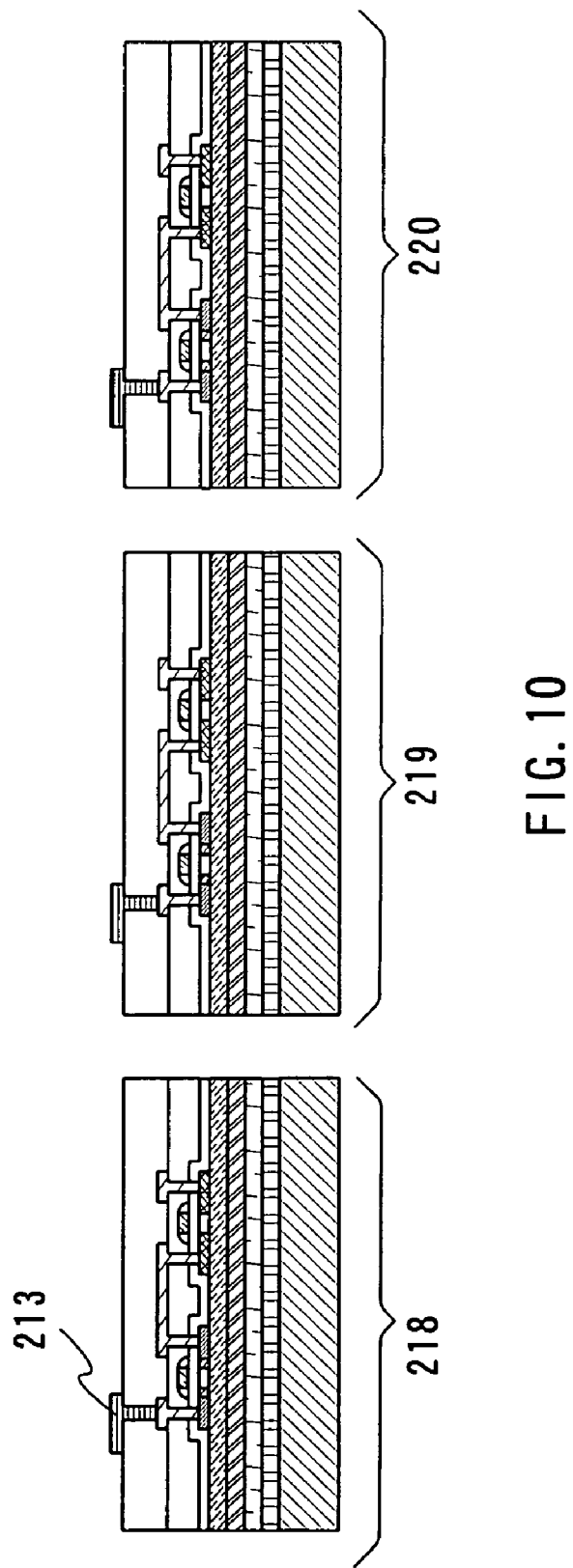
FIG. 10 is a diagram describing Embodiment Mode 2.

After a cutting process, a plurality of integrated circuit devices 218 to 220 which have structures shown in FIG. 10 are formed (see FIG. 10). Since the electrodes 213 are exposed in the integrated circuit devices 218 to 220, the integrated circuit devices 218 to 220 can be connected electrically with an external portion by the electrodes 213.

A mounting process after that is uses the same process which is described using FIGS. 5A to 6B in Embodiment Mode 1.

In a semiconductor device which is completed through the above process (in this case, an RFID), the thickness is thin, and lightweight. In addition, since the semiconductor device is thin, if the semiconductor device (RFID) is mounted on goods, the design property is not degraded. Further, the semiconductor device (RFID) can be bonded to any kind of curved surface along the curve surface. For example, when the semidconductor device (RFID) is put through a copying machine or the like, a chip or a chip connection portion is not damaged, and when the semiconductor device (RFID) is mounted on a pen, a circular shape of a pen can be kept.

In this embodiment mode described above, an example of forming a layer mainly containing diamond like carbon as a stopper layer is shown. When a DLC layer is used as a stopper layer as in this embodiment mode, heating conditions of an element formed over the DLC layer are not limited by heat resistance of diamond like carbon. However, a material used as a stopper layer is not limited to DLC. As long as a material used for the stopper layer has a resistance property with respect to an etchant used for etching the first substrate 200, the material used for the stopper layer is not limited.

Layers for improving adhesion (buffer layers) 201 and 203 are not limited to the material given in this embodiment mode. The layer for improving adhesion (buffer layer) 201 may be formed with a material of which adhesion with a substrate is good, and adhesion with a stopper layer is good. In addition, the layer for improving adhesion (buffer layer) 203 may be formed with a material of which adhesion with a stopper layer is good, and adhesion with a layer including an element is good.

In addition, in this embodiment mode, a case in which etching by chemical reaction is used when a substrate is thinned or removed is described; however, when a substrate is thinned or removed, etching by chemical reaction can be combined with a grinding or polishing method. In other words, etching by chemical reaction is combined with Embodiment Mode 1. However, when etching by chemical reaction can be combined with a grinding or polishing method as a method for thinning or removing a substrate, it is necessary to select a material which has a higher degree of hardness than the first substrate and resistance to the etchant as a stopper layer.

Embodiment Mode 3

This embodiment mode is described using FIGS. 11A to 14C. In this embodiment mode, a case where a substrate is removed by peeling off the substrate by controlling an adhesion property of a DLC layer is described.

A layer for improving adhesion (buffer layer) 301, a DLC layer 302, and a layer for improving adhesion (buffer layer) 303 are formed in order over one surface of a first substrate 300 (see FIG. 11A).

Next, a layer including an element 304 is formed over the layer for improving adhesion (buffer layer) 303 (see FIG. 11B). For example, this layer may have a wire, a capacitor, an inductor (antenna) or the like, and the combination thereof instead of a unit circuit such as a TFT circuit. In this particular example, a TFT circuit 305 is formed in the layer including an element 304. In this figure, the TFT circuit 305 has an N-channel transistor 306 and a P-channel transistor 307. Each of the N-channel transistor 306 and the P-channel transistor 307 has a semiconductor film 308, a gate insulating film 309, a gate electrode 310, an interlayer insulating film 311, and a source or drain electrode 335.

The preceding process may be performed similarly to Embodiment Mode 1.

Next, an insulating film 312 is formed over the layer including an element 304, and an opening portion is formed in the insulating film 312. Then, an antenna 313 which is contacted with the TFT circuit 305 is formed (see FIG. 11C).

A strength retention layer 314 is formed so as to sandwich the layer including an element 304 between the first substrate 300 and the strength retention layer 314. In this example, a resin film is formed by a screen printing method. And then baked in a oven, thereby forming the strength retention layer 314 (see FIG. 12A). This layer exists to maintain the strength of the layer including an element 304 and to prevent a crack or the like enters from occurring when the first substrate 300 is peeled off at a place where the adhesion between the layer mainly containing DLC and the first substrate 300 is weak, in a step which takes place in a later process.

Next, a second substrate 315 is bonded over the insulating film 312 and the electrode 313 by using a first adhesive 320 (see FIG. 12B). The second substrate 315 is a substrate for keeping flatness of the layer including an element 304 and for protecting flatness of the layer including an element 304. Adhesion of the first adhesive 320 is strong in a nomal state, and it is preferable that the first adhesive 320 has a property such that the adhesion becomes weak by light irradiation or heating. Specifically, a UV peelable adhesive of which the adhesion becomes weak by irradiating ultraviolet radiation, or a heat peeling adhesive in which the adhesion becomes weak by heating may be used. In this example, a UV peelable adhesive is used as the first adhesive 320.

In grinding, polishing, or the like, an elastic substrate (for example, an expand film, or the like) is further bonded over the second substrate 315, and a space between separated substrates is made wider by expanding the elastic substrate after separating the second substrate 315, and the substrates can be handled easily. Accordingly, such a method can be employed. Since an object of this example is to make the first substrate thinner by using flatness of the second substrate; therefore, such a method is not used. When the second substrate 315 does not have flexibility, the second substrate becomes flexibile by thinning the second substrate 315 by using grinding or polishing of Embodiment Mode 1 or etching by chemical reaction of Embodiment Mode 2.

The second substrate 315 side is peeled off by using a physical method such as a roller in which force is applied equally, and the first substrate is removed (see FIG. 12C). This process uses a property in which an adhesion property between the layer for improving adhesion (buffer layer) 301 and the first substrate 300 is the weakest in adhesion of the DLC layer which is a three-layer structure in this example. Depending on the relative relation of adhesion of the layer for improving adhesion (buffer layer) 301, the DLC layer 302, and the layer for improving adhesion (buffer layer) 303, it is possible to peel off the first substrate from any one of the layer for improving adhesion (buffer layer) 301, the DLC layer 302, or the layer for improving adhesion (buffer layer) 303 which contains which mainly contains DLC. There is variation in a layer peeled off in a surface of the substrate. However, it is preferable that the layer for improving adhesion (buffer layer) 301 which is in contact with the layer including an element 304 is left, and a DLC coat is maintained under the layer 304 including an element.

Figure 13A:
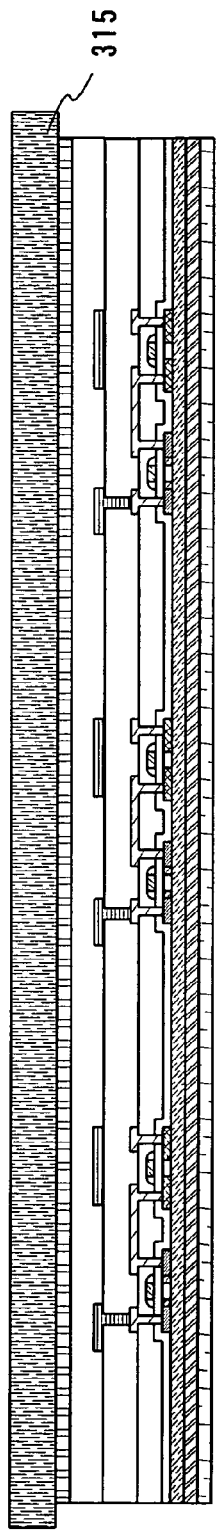
FIGS. 13A to 13C are diagrams describing Embodiment Mode 3.
Figure 13B:
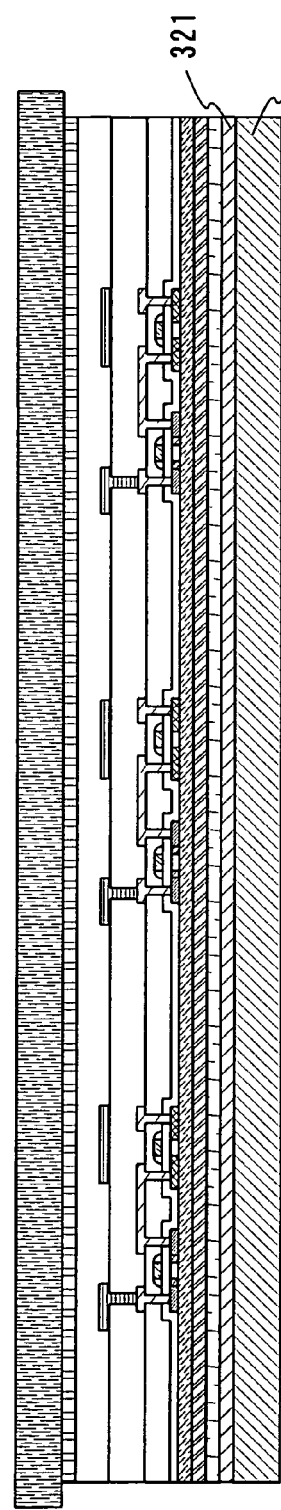

After this process is finished, all of the first substrate 300 is removed (see FIG. 13A).

In this example, the electrode 313 electrically connected with the TFT circuit 305 is formed on the second substrate 315 side. In addition, the electrode can be electrically connected with the TFT circuit 305 on the first substrate 300 side, and mounted to another substrate (for example, a substrate on which an antenna is formed, or the like). In this case, the third substrate below may not necessarily be provided. A method to form the electrode electrically connected with the TFT circuit 305 in the first substrate 300, in other words, a surface in which a DLC layer is existed, is performed similarly to Embodiment Mode 1.

In this example, the integrated circuit is mounted on the second substrate 315 side. If the second substrate 315 is peeled off here, the layer including an element 304 is curled by stress, and a problem occurs in the later mounting or handling. A third substrate 316 is bonded from the side opposite to the second substrate 315 by using a second adhesive 321 in order to prevent the above problem (see FIG. 13B). In this example, since the layer for improving adhesion (buffer layer) 301 is exposed in a surface, the third substrate 316 is bonded to the layer for improving adhesion (buffer layer) 301 by using the second adhesive 321. The third substrate 316 make it easier to keep strength of after removing the second substrate 315, handling, or mounting, and the third substrate 316 is used for protecting the layer including an element 304. In a case that the strength retention layer 314 has enough strength for strength retention after peeling off the second substrate 315 or when handling or mounting is performed, the third substrate below is not necessary.

Adhesion of the second adhesive 321 is strong in a nomal state, and it is preferable that a property such that the adhesion becomes weak by light irradiation or heating. Specifically, a UV peelable adhesive of which the adhesion becomes weak by irradiation with ultraviolet radiation, or a heat peelable adhesive of which the adhesion becomes weak by heating may be used. In addition, an adhesive of which the adhesion becomes weak by a mechanism (heat peeling, UV peeling), temperature, wave length, or light irradiating direction which is different from the first adhesive 320 is preferable as the second adhesive 321, and the combination which can peel off the second substrate which is bonded with the third substrate is used. In this example, an adhesive having a heat peeling property is used.

Here, a laminated body having the insulating film 312, the second substrate 315, the first adhesive 320, the strength retention layer 314, the insulating film 312, the layer including an element 304, and the layer which mainly contains DLC (the layer for improving adhesion (buffer layer) 301, the DLC layer 302, and the layer for improving adhesion (buffer layer) 303) may be separated so as to be asigned to every TFT circuit 305 formed in the layer including an element 304 from the second substrate 315 side. Alternatively, the third substrate 316 is also divided, and then each of TFT circuits 305 formed in the layer including an element 304 may be completely divided. In this example, dividing is not performed at this time. First, the process of removing the second substrate is performed.

Figure 13C:
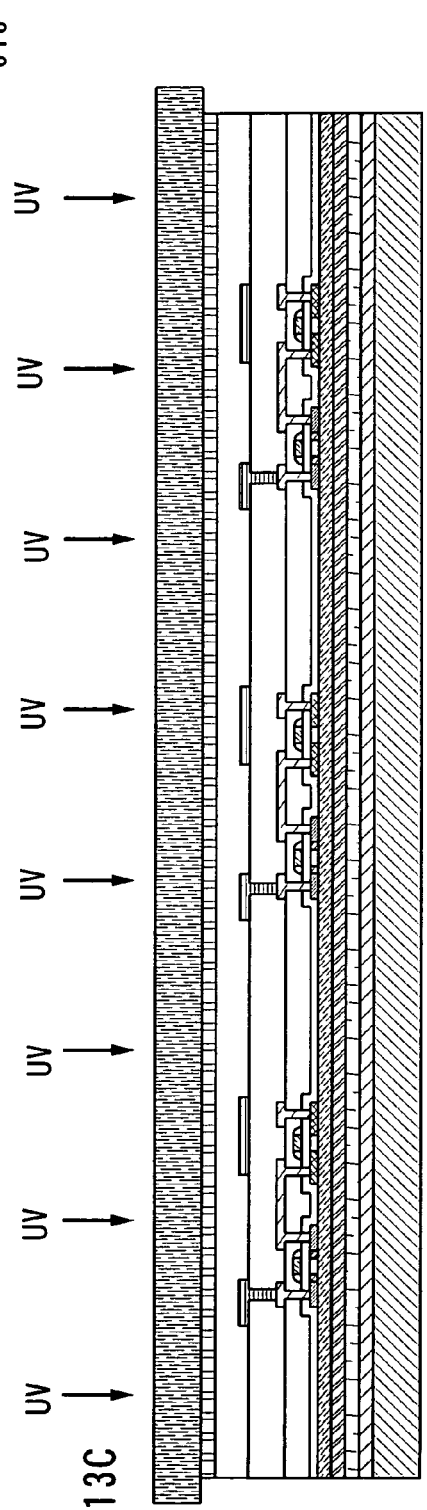

Subsequently, a process for reducing adhesion of the first adhesive 320 is performed (see FIG. 13C). In this case, UV irradiation is conducted. In a case of a combination of the first substrate to the third substrate where UV radiation does not reach an adhesive even if UV radiation is applied from either a top surface or a bottom surface (if the first substrate is removed, it is a combination of the second substrate and the third substrate), UV radiation is applied from a side surface, and the adhesive is peeled off. If only the third substrate 316 does not transmit UV radiation, first, UV radiation is applied from the side of the first substrate 300 to weaken adhesion, and then the third substrate is bonded. If the first adhesive 320 has a heat peeling property, heating is performed in such a way that the third substrate does not peel off. If the third substrate is not removed after mouting, any adhesive can be used as the second adhesive.

Concequently, adhesion of the first adhesive 320 becomes weak, a laminated body having the strength retention layer 314, the insulating film 312, the layer including an element 304, the first adhesive 320, the layer which mainly contains DLC (the layer for improving adhesion (buffer layer) 301, the DLC layer 302, and the layer for improving adhesion (buffer layer) 303), the second adhesive 321, and the third substrate 316 (the first substrate 300 may be included) can be separated from the second substrate 315 by a physical means. Then, the second substrate 315 can be removed (see FIG. 14A).

Subsequently, a laminated body having the strength retention layer 314, the insulating film 312, the layer including an element 304, the first adhesive 320, the layer which mainly contains DLC (the layer for improving adhesion (buffer layer) 301, the DLC layer 302, and the layer for improving adhesion (buffer layer) 303), the second adhesive 321, and the third substrate 316 (the first substrate 300 may be included) is cut by a cutting means (see FIG. 14B). In this case, the laminated body is cut to be separated for every TFT circuit 305 formed in the layer including an element 304. FIG. 14B shows an example of cutting using a laser as a cutting means. Note that a cutting means corresponds to a laser, a dicer, a wire saw, or a scriber.

After a cutting process, a plurality of integrated circuit devices 317 to 319 which have structures shown in FIG. 14C are formed (see FIG. 14C).

Subsequently, each of the integrated circuits is sealed with a film having an adhesive layer on the surface. A film used for sealing may be the same as the film used for sealing in Embodiment Mode 1.

In a semiconductor device which is completed through the above process (in this case, an RFID), the thickness is thin, and lightweight. In addition, since the semiconductor device is thin, if the semiconductor device (RFID) is mounted on goods, the design property is not degraded. Further, the semiconductor device (RFID) can be bonded to any kind of curved surface along the curve surface. For example, when the semidconductor device (RFID) is put through a copying machine or the like, a chip or a chip connection portion is not damaged, and when the semiconductor device (RFID) is mounted on a pen, a circular shape of a pen can be kept.

If the manufacturing method of the integrated circuit device described in this embodiment mode is used, heat treatment can be performed without providing a significant change in adhesion due to heat resistance of DLC. Therefore, there is a merit that limitations on process are reduced in manufacturing a thin integrated circuit device.

Layers for improving adhesion (buffer layers) 301 and 303 are not limited to the material given in this embodiment mode. The layer for improving adhesion (buffer layer) 301 may be formed with a material of which adhesion with a substrate is good, and adhesion with a stopper layer is good. In addition, the layer for improving adhesion (buffer layer) 303 may be formed with a material of which adhesion with a stopper layer is good, and adhesion with a layer including an element is good.

This embodiment mode describes the case that peeling off of the substrate by controlling an adhesion property of the DLC layer is used when the substrate is thinned or removed; however, when a substrate is thinned or removed, peeling off the substrate can be combined with grinding or polishing, or etching by chemical reaction. Therefore, this embodiment mode can be combined with Embodiment Mode 1 or 2.

By combining an adhesion controlling method with a method of grinding or polishing, in the process of grinding or polishing, a substrate is peeled off by shock of grinding or polishing, and the substrate can be removed. In addition, in a case that a method of grinding or polishing is combined with an adhesion controlling method, and when etching by chemical reaction method is combined with an adhesion controlling method, even if the substrate is thinned to a degree of having flexibility by a grinding or a polishing method, or etching by chemical reaction method, even in the case of forming an integrated circuit over the substrate that is originally hard, since the substrate becomes thin to have flexibility, the substrate can be removed while curving the substrate.

Embodiment Mode 4

This embodiment mode is described by using FIGS. 15A to 19. In this embodiment mode, an example in which a layer which mainly contains DLC is formed over a substrate as a stopper layer when the substrate is thinned by grinding or polishing is described. In this embodiment mode, the case that a wireless device which is not in contact with an external portion is manufactured is described.

Figure 15A:
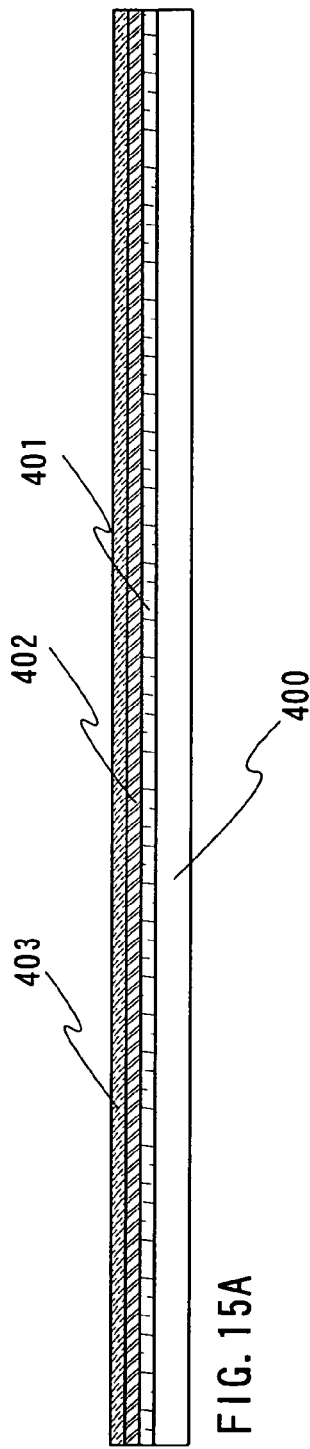
FIGS. 15A to 15C are diagrams describing Embodiment Mode 4.

A layer for improving adhesion (buffer layer) 401, a DLC layer 402, and a layer for improving adhesion (buffer layer) 403 are formed in order over one surface of a first substrate 400 (see FIG. 15A).

Figure 15B:
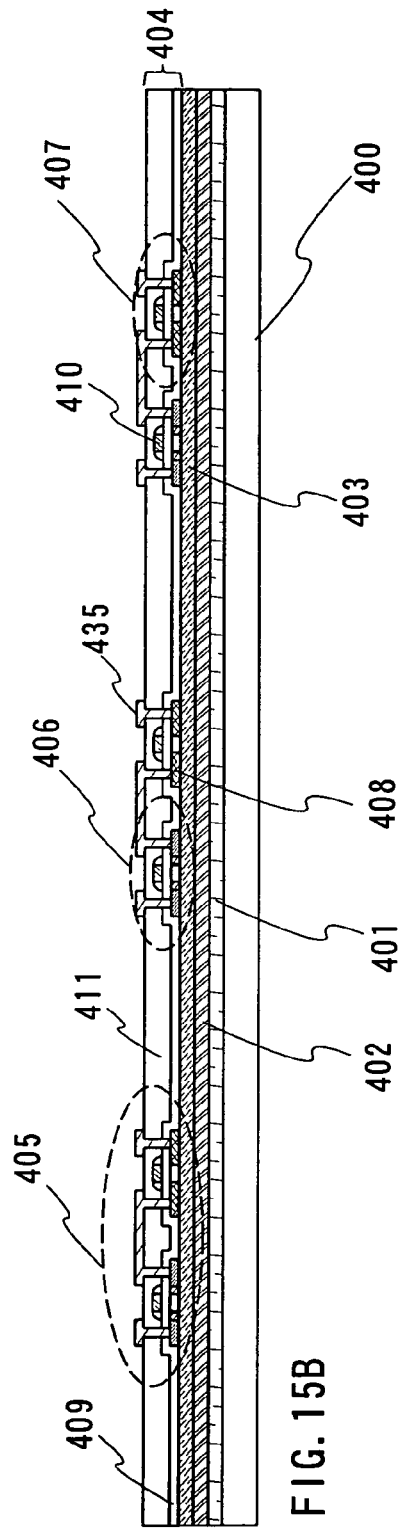
Figure 15C:
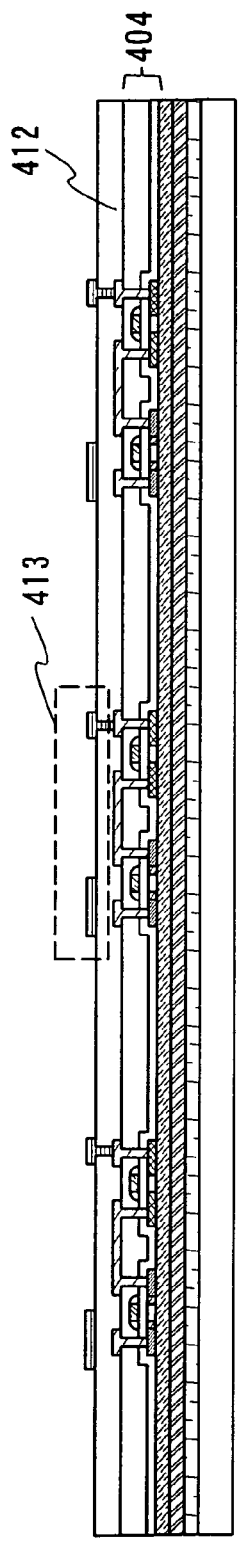

Next, a layer including an element 404 is formed over the layer for improving adhesion (buffer layer) 403 (see FIG. 15B). This layer may have a wire, a capacitor, an inductor (antenna) or the like, and the combination thereof instead of a unit circuit such as a TFT circuit. In this particular example, a TFT circuit 405 is formed in the layer including an element 404. In this figure, the TFT circuit 405 has an N-channel transistor 406 and a P-channel transistor 407. Each of the N-channel transistor 406 and the P-channel transistor 407 has a semiconductor film 408, a gate insulating film 409, a gate electrode 410, an interlayer insulating film 411, and a source or drain electrode 435.

The preceding process may be performed similarly to Embodiment Mode 1.

In this example, an integrated circuit device used without connecting with an external portion is manufactured. In this example, an integrated circuit device which communicates by using an antenna is manufactured (see FIG. 15C). In this example, an example of an integrated circuit device which communicates by using an antenna is described; however, any communication metho such as an antenna which communicates by using electromagnetic wave, light, magnetism, electric potential, acoustics, physical switch, or the like is not limited. An internal sensor, a display portion showing memory data, a vibrator, a speaker, or the like may be used. On this occasion, an insulating film 412 is formed over the layer including an element 404, and an opening portion is formed in the insulating film 412. Next, an antenna 413 which is electrically connected with the TFT circuit 405 is formed.

A layer which mainly contains DLC is formed thereover. Specifically, a layer for improving adhesion (buffer layer) 431 and a DLC layer 432 are formed (see FIG. 16A). Further, a layer for improving adhesion (buffer layer) may be formed thereover, and a three-layer structure may be formed; however, since an adhesion property is not all that necessary in a later process, two-layer structure is used in this example. DLC is formed front and rear surfaces, and an integrated circuit device which is superior to a gas barrier property or the like can be manufactured.

Figure 20A:
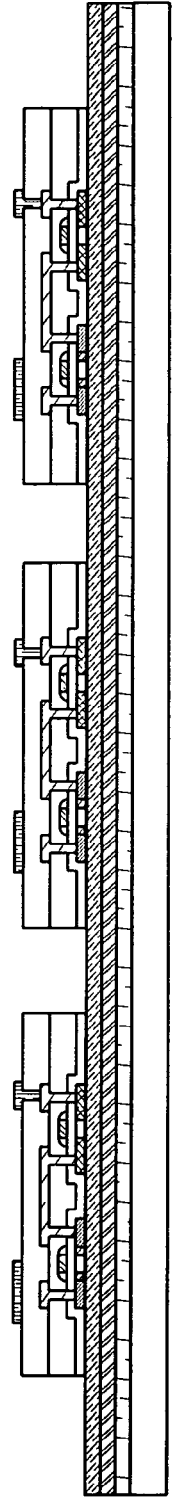
FIGS. 20A to 20C are diagrams describing Embodiment Mode 4.
Figure 20B:
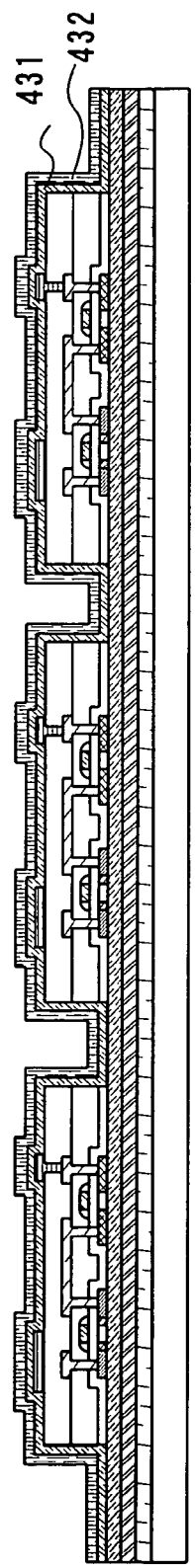

When all of elements are covered with DLC, a gas barrier property by coating with DLC obtains the biggest effect. After etching each region between TFTs 405 formed in the layer including an element 404 to the layer which mainly contains DLC (the layer for improving adhesion (buffer layer) 401, the DLC layer 402 the layer for improving adhesion (buffer layer) 403) as shown in FIG. 20A before forming a layer which mainly contains DLC (a layer for improving adhesion (buffer layer) 431 and a DLC layer 432) in FIG. 16A, if each TFT 405 is divided, each TFT 405 is wrapped with DLC by forming a layer which mainly contains DLC (a layer for improving adhesion (buffer layer) 431 and a DLC layer 432) as shown in FIG. 20B. In this state, since DLC has a strong chemical proof property, there is a case that an etchant resistant layer is not necessary when the substrate is thinned or removed by etching by chemical reaction in a process of manufacturing an integrated circuit device which has a structure of covering the TFT circuit 405 with DLC by the method described in Embodiment Mode 2, or the like. An after process is similarly to a case forming the DLC layer at a front or a rear side.

Figure 20C:
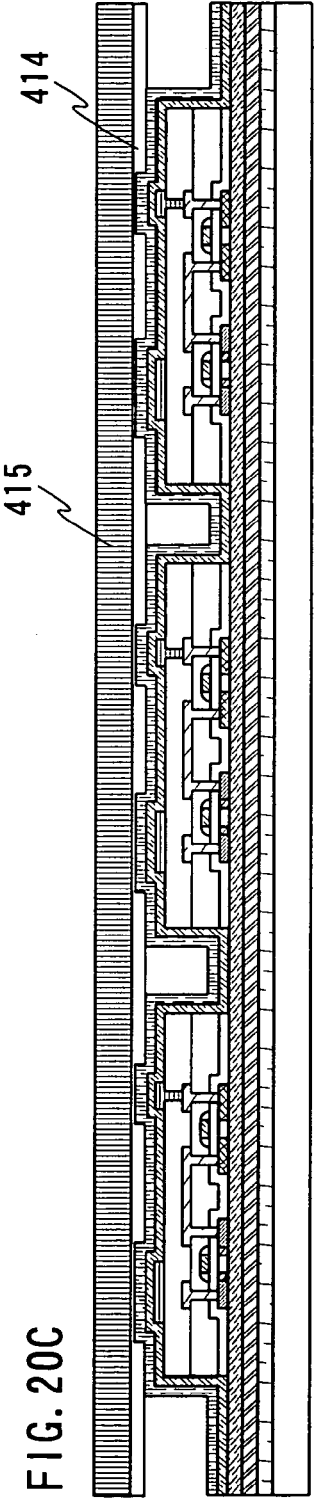

Next, a second substrate 415 is bonded over the DLC layer 432 by using a first adhesive 414 (see FIGS. 16B and 20C). The second substrate 415 is a substrate for keeping flatness of the layer including an element 404 and for protecting flatness of the layer including an element 404. Adhesion of the first adhesive 414 is strong in a nomal state, and it is preferable that the first adhesive 414 has a property such that the adhesion becomes weak by light irradiation or heating. Specifically, a UV peelable adhesive in which the adhesion becomes weak by irradiation with ultraviolet radiation, or a heat peelable adhesive of which the adhesion becomes weak by heating may be used. In this example, a UV peelable adhesive is used as the first adhesive 414.

In grinding, polishing, or the like, an elastic substrate (for example, an expand film, or the like) is further bonded over the second substrate 415, and a space between separated substrates is made wider by expanding the elastic substrate after separating the second substrate 415, and the substrates can be handled easily. Accordingly, such a method can be employed. Since an object of this example is to make the first substrate thinner by using flatness of the second substrate 415; therefore, in this example, such a method is not used.

Next, a surface opposite to one surface (a surface over which in the TFT circuit 405 is formed) of the first substrate 400 is ground or polished by a grinding means or a polishing means (see FIGS. 16C and 21A). In this example, grinding is performed until a thickness of the first substrate 400 becomes 100 μm or less. Then, polishing is performed until the thickness of the first substrate 400 becomes 20 μm or less.

Here, an example in which the first substrate 400 is ground until the thickness becomes 100 μm or less, and then, the first substrate 400 is polished until the thickness becomes 20 μm or less is shown; however, grinding or polishing may be performed at least until the thickness of the first substrate 400 becomes thin to be easily separated. If the substrate is made thinner than before, the thickness should be 100 μm or less.

Since the substrate becomes strong against bending when the thickness becomes 20 μm or less, the substrate can be made not only thin but also flexible (an advantage which can be assumed a thing having flexibility), which is preferable. In a case of using an insulating substrate, since an advantage of thinning is significant when the thickness of the substrate is 10 μm or less where dependency of variations in the thickness is considerable a semiconductor substrate or a conductive substrate, it is more preferable. In the semiconductor substrate or the conductive substrate, it is preferable to remove the substrate completely; however, when an element is formed in the substrate, the thickness of the substrate is in the range of 10 to 100 μm.

In this grinding process, the surface of the first substrate 400 is ground or polished by rotating one or both a stage on which the first substrate is fixed and of the grinding means or the polishing means 417. At this time, not only the first substrate 400 but also the second substrate 415 may be ground or polished at the same time. This example shows a case where only the first substrate 400 is ground or polished.

The grinding means or the polishing means 417 is, for example, a grinding stone used for grinding or loose abrasive process grain treatment used for polishing. Thereafter, cleaning may be performed as necessary in order to remove dust generated by a grinding or a polishing process.

Figure 17A:
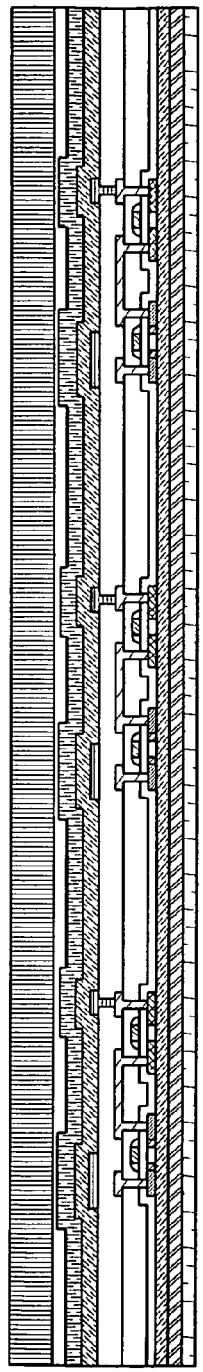
FIGS. 17A to 17C are diagrams describing Embodiment Mode 4.
Figure 17B:
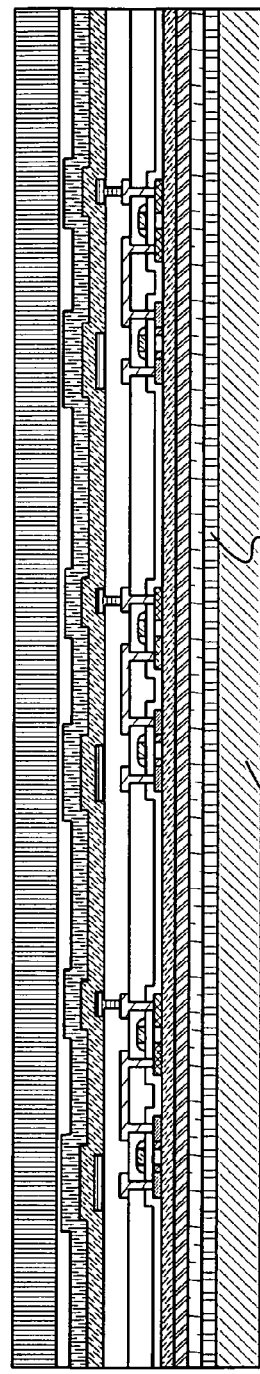

After this process is finished, the first substrate 400 may be removed entirely (see FIGS. 17A and 21B). FIGS. 17A and 21B show a case that the first substrate is removed entirely.

In addition, when the first substrate is thinned by using a grinding means or a polishing means, the first substrate 400 may be peeled off from the layer for improving adhesion (buffer layer) 401 by shock and vibration of grinding or polishing. Controlling of the adhesion is described in detail in Embodiment Mode 3.

In this example, mounting on another substrate is not performed; however, after covering with DLC, contact can be performed from a front layer or a rear layer. In a case that mounting is performed on a side of the first substrate 400 or the layer which mainly contains DLC (the layer for improving adhesion (buffer layer) 401, the DLC layer 402, the layer for improving adhesion (buffer layer) 403), the method described in Embodiment Mode 1 is used.

If the second substrate 415 is peeled off here, the layer including an element 404 is curled by stress, and a problem occurs in the later mounting or handling. A third substrate 428 is bonded from the side opposite of the second substrate 415 by using a second adhesive 427 in order to prevent the above problem. In other words, at this time, when the first substrate 400 remains, the third substrate 428 is bonded to the first substrate 400 by using the second adhesive 427. When the first substrate 400 is removed, and the layer for improving adhesion (buffer layer) 401 is exposed in a surface, the third substrate 428 is bonded to the layer for improving adhesion (buffer layer) 401 by using the second adhesive 427. When the first substrate 400 and the layer for improving adhesion (buffer layer) 401 are removed and the DLC layer 402 is exposed in a surface, the third substrate 428 is bonded to the DLC layer 402 by using the second adhesive 427 (see FIGS. 17B and 21C). In this example, the third substrate 428 is bonded to the layer for improving adhesion (buffer layer) 401. The third substrate 428 makes it easier to keep strength after removing the second substrate 415, handling, or mounting, and the third substrate 428 is used for protecting the layer including an element 404.

Adhesion of the second adhesive 427 is strong in a nomal state, and it is preferable that the first adhesive 414 has a property such that the adhesion becomes weak by light irradiation or heating. Specifically, a UV peelable adhesive of which the adhesion becomes weak by irradiation with ultraviolet radiation, or a heat peelable adhesive of which the adhesion becomes weak by heating may be used. In addition, an adhesive of which the adhesion becomes weak by a mechanism (heat peeling, UV peeling), temperature, wave length, or light irradiating direction which is different from the first adhesive 414 is preferable as the second adhesive 427, and the combination which can peel off the second substrate which is bonded with the third substrate 428 is used. In this example, an adhesive having a heat peeling property is used as the second adhesive 427.

Here, a laminated body having the second substrate 415, the first adhesive 414, the layer which mainly contains DLC (the layer for improving adhesion (buffer layer) 431, the DLC layer 432), the insulating film 412, the layer including and element 404, the layer which mainly contains DLC (the layer for improving adhesion (buffer layer) 401, the DLC layer 402, and the layer for improving adhesion (buffer layer) 403) may be separated so as to be assigned to every TFT circuit 205 formed in the layer including an element 404 from the second substrate 415 side. Alternatively, the third substrate is also divided, and then each of TFT circuits 405 formed in the layer including an element 404 may be completely divided. In this example, dividing is not performed at this time. First, the process of removing the second substrate is performed.

Figure 17C:
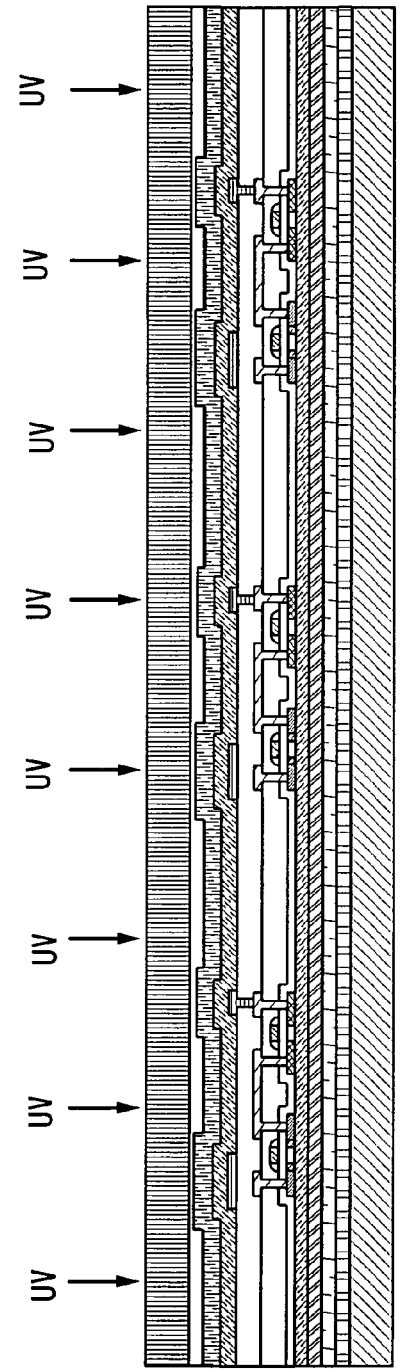
Figure 22A:
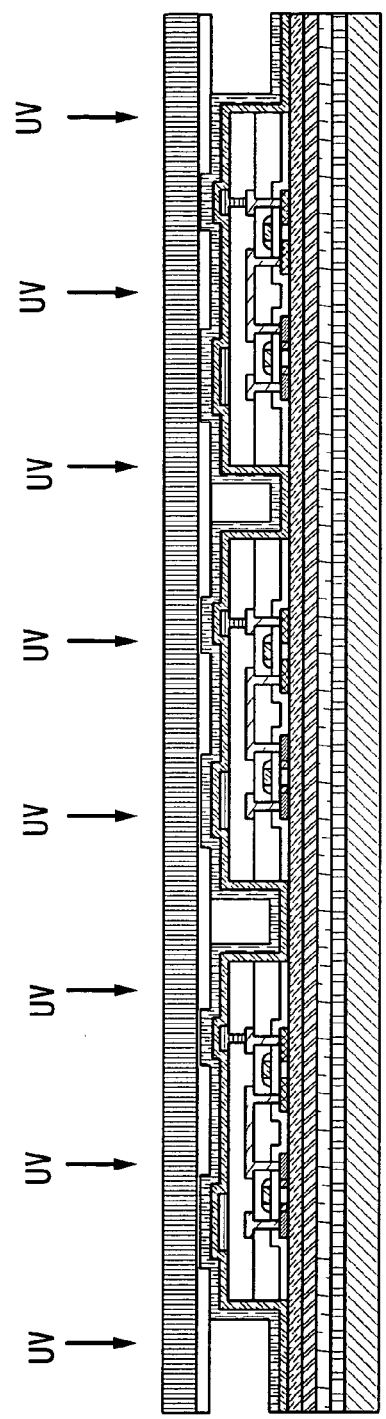
FIGS. 22A to 22C are diagrams describing Embodiment Mode 4.

Subsequently, a process for reducing adhesion of the first adhesive 414 is performed (see FIGS. 17C and 22A). In this case, UV irradiation is conducted. In a case of a combination of the first substrate to the third substrate 428 where UV radiation does not reach an adhesive even if UV radiation is applied from either a top surface or a bottom surface (if the first substrate is removed, it is a combination of the second substrate and the third substrate), UV radiation is applied from a side surface, and the adhesive is peeled off. If only the third substrate 428 does not transmit UV radiation, first, UV radiation is applied from the side of the first substrate 400 to weaken adhesion, and then the third substrate is bonded. If the first adhesive 414 has a heat peeling property, heating is performed in such a way that the third substrate does not peel off. If the third substrate is not removed after mouting, any adhesive can be used as the second adhesive.

Figure 22B:
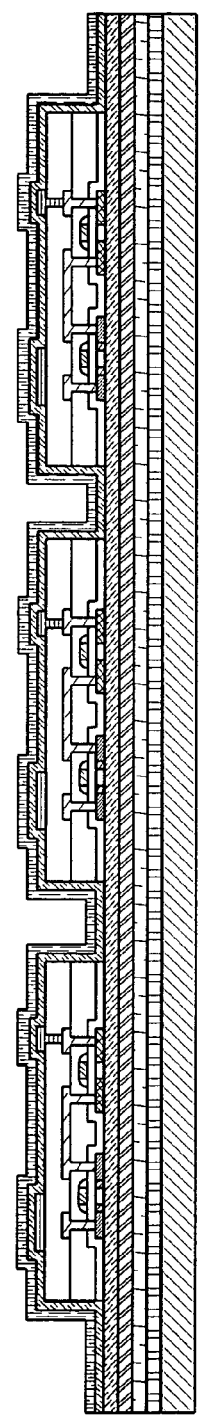

Concequently, adhesion of the first adhesive 414 becomes weak, a laminated body having the layer which mainly contains DLC (the layer for improving adhesion (buffer layer) 431, the DLC layer 432), the insulating film 412, the layer including an element 404, the layer which mainly contains DLC (the layer for improving adhesion (buffer layer) 401, the DLC layer 402, and the layer for improving adhesion (buffer layer) 403), the second adhesive 427, and the third substrate 428 (the first substrate 400 may be included) can be separated from the second substrate 415 by a physical means. Then, the second substrate 415 can be removed (see FIGS. 18A and 22B).

Figure 18A:
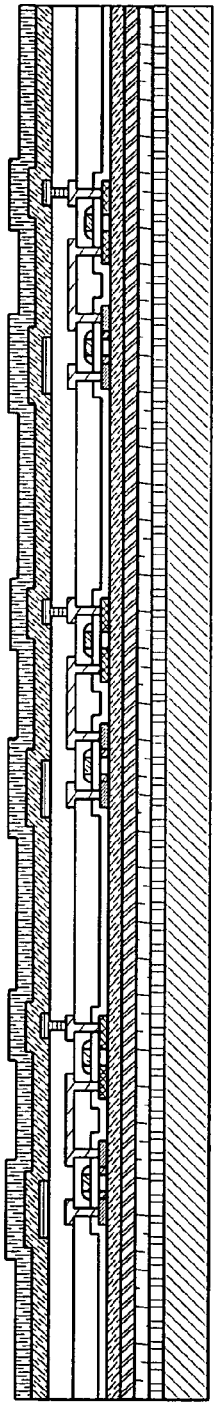
FIGS. 18A to 18C are diagrams describing Embodiment Mode 4.
Figure 18B:
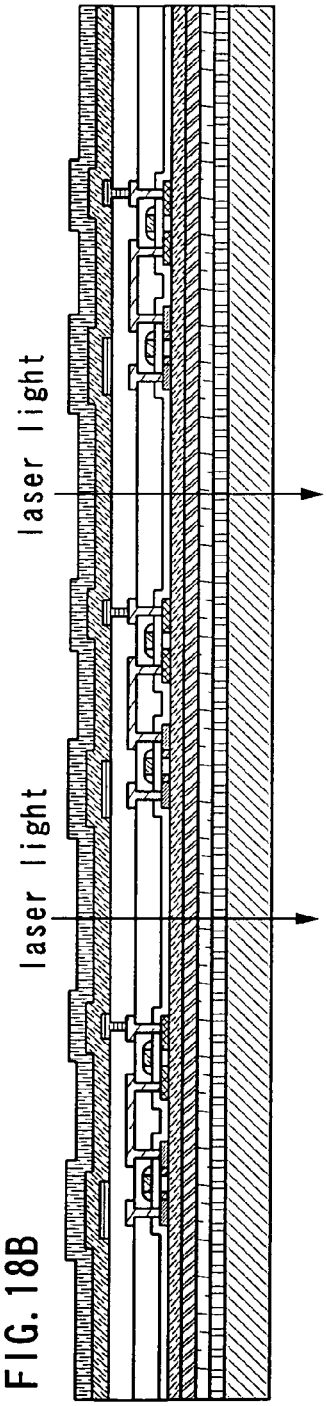
Figure 22C:
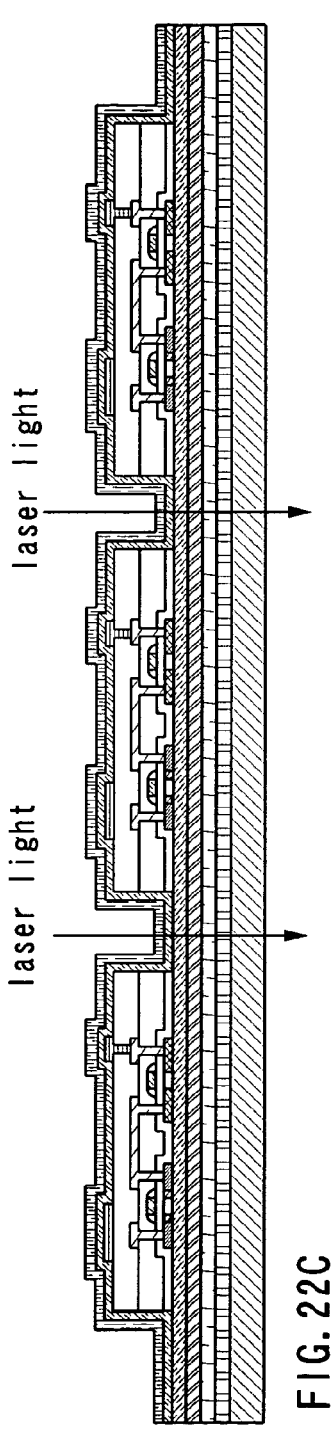

Subsequently, a laminated body having the layer which mainly contains DLC (the layer for improving adhesion (buffer layer) 431, the DLC layer 432), the insulating film 412, the layer including an element 404, the layer which mainly contains DLC (the layer for improving adhesion (buffer layer) 401, the DLC layer 402, and the layer for improving adhesion (buffer layer) 403), the second adhesive 427, and the third substrate 428 (the first substrate 400 may be included) is cut by a cutting means (see FIGS. 18B and 22C). In this case, each of the layer which mainly contains DLC (the layer for improving adhesion (buffer layer) 431, the DLC layer 432), the insulating film 412, the layer including an element 404, the layer which mainly contains DLC (the layer for improving adhesion (buffer layer) 401, the DLC layer 402, and the layer for improving adhesion (buffer layer) 403), and the TFT circuit 405 formed in the layer including an element 404 is cut to be separated. FIGS. 18B and 22C show an example of cutting using a laser as a cutting means. Note that a cutting means corresponds to a laser, a dicer, a wire saw, or a scriber.

Figure 18C:
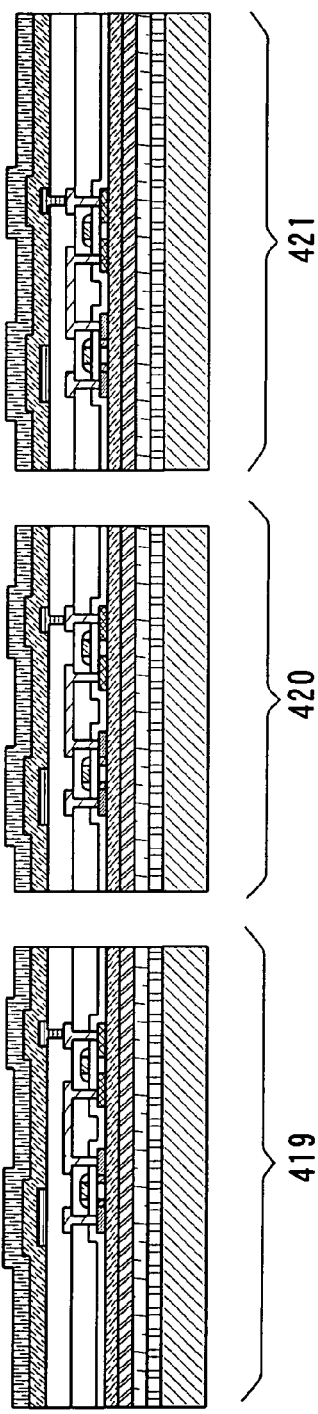
Figure 23A:
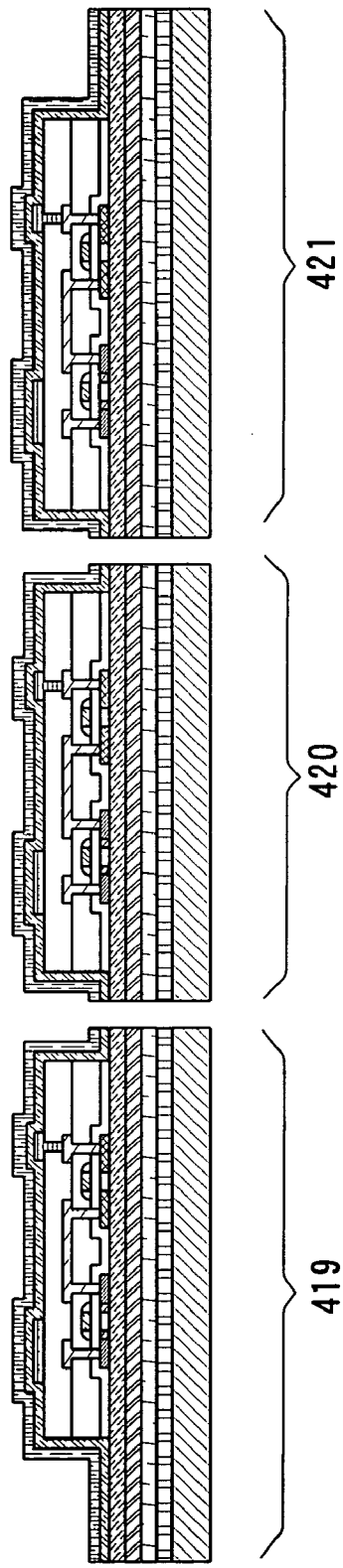
FIGS. 23A and 23B are diagrams describing Embodiment Mode 4.

After a cutting process, a plurality of integrated circuit devices 419 to 421 which have structures shown in FIGS. 18C and 23A are formed (see FIGS. 18C and 23A).

Figure 19:
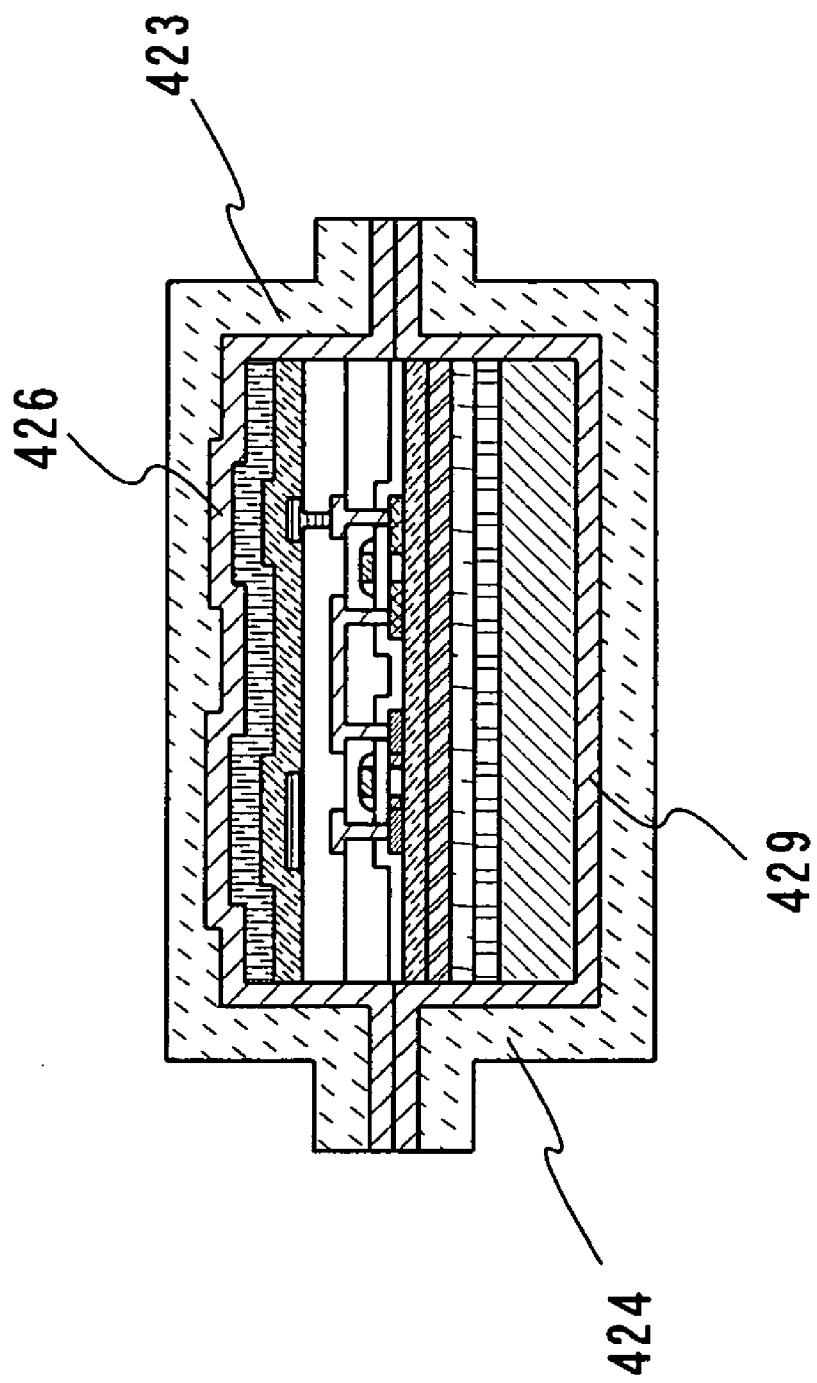
FIG. 19 is a diagram describing Embodiment Mode 4.
Figure 23B:
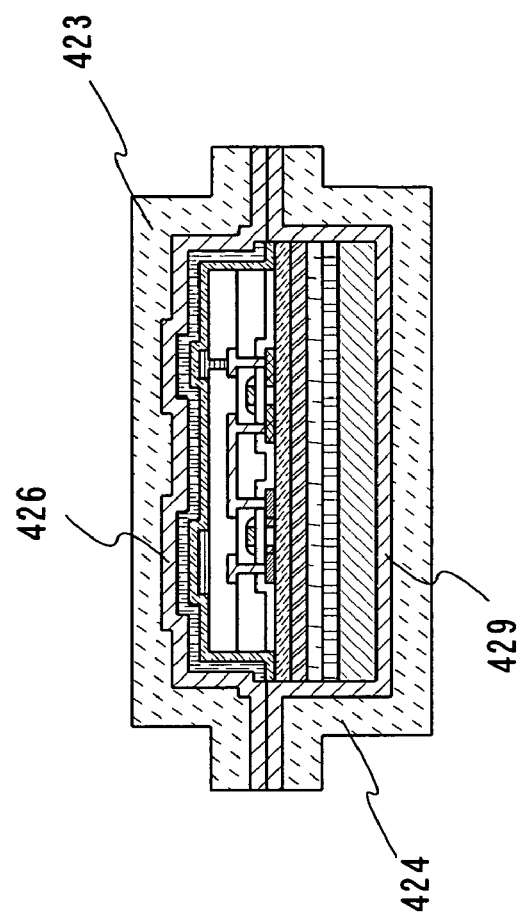

In this example, the third substrate 428 is not removed thereafter, and both sides of the integrated circuit device are sealed with a first film 423 and a second film 424 (see FIGS. 19 and 23B). Adhesive layers 426 and 429 are formed on the surface of the first film 423 and the second film 424 respectively. Sealing of both surfaces may be performed separately for each surface or both surfaces at the same time.

If adhesion of the second adhesive 427 can be lowered, sealing may be performed after removing the third substrate 428. For example, if an adhesive of which adhesion force is weakened by heating is used as the second adhesive 427, the third substrate 428 can be removed by heating treatment. Sealing of both surfaces may be performed separately or at the same time; however, when curl of the integrated circuit device is considered, it is preferable that a surface opposite to the third substrate is sealed with the first film 423 while leaving the third substrate 428, and after peeling off the third substrate, sealing is performed with the second film 424.

In a semiconductor device which is completed through the above process (in this case, an RFID), the thickness is thin, and lightweight. In addition, since the semiconductor device is thin, if the semiconductor device (RFID) is mounted on goods, the design property is not degraded. Further, the semiconductor device (RFID) can be bonded to any kind of curved surface along the curve surface. For example, when the semidconductor device (RFID) is put through a copying machine or the like, a chip or a chip connection portion is not damaged, and when the semiconductor device (RFID) is mounted on a pen, a circular shape of a pen can be kept.

In this embodiment mode described above, an example of forming a layer which mainly contains diamond like carbon is formed as a stopper layer is shown. When a DLC layer is used as a stopper layer as in this embodiment mode, heating conditions of an element formed over the DLC layer are not limited by heat resistance of diamond like carbon. However, a material used as a stopper layer is not limited to DLC. As long as the material used for the stopper layer has higher hardness than the first substrate 400, it is not limited. For example, since TiCN (titanium carbonitride), TiAlN (titanium aluminum nitride), or the like having high hardness can be used. In particular, since TiCN has not only high hardness but also low coefficient of friction, TiCN is suitable.

In addition, as a stopper layer, a material which has higher hardness and low coefficient of friction than the first layer 400 is preferable.

Layers for improving adhesion (buffer layers) 401 and 403 are not limited to the material given in this embodiment mode. The layer for improving adhesion (buffer layer) 401 may be formed with a material of which adhesion with a substrate is good, and adhesion with a stopper layer is good. In addition, the layer for improving adhesion (buffer layer) 203 may be formed with a material of which adhesion with a stopper layer is good, and adhesion with a layer including an element is good.

In addition, in this embodiment mode, an example in which grinding or polishing is used for thinning or removing the substrate is described; however, peeling off by etching by chemical reaction or controlling an adhesion property of DLC may be used. When the substrate is thinned of removed, a method by grinding or polishing can be combined with a method of etching by chemical reaction, a method by grinding or polishing can be combined with a method using peeling off by controlling an adhesion property of DLC, or a method of etching by chemical reaction can be combined with a method using peeling off by controlling an adhesion property of DLC. Therefore, this embodiment mode can be combined with Embodiment Modes 2 or 3.

As a method of thinning or removing the substrate, when etching by chemical reaction can be combined with a grinding or polishing method as a method for thinning or removing a substrate, it is necessary to select a material which has a higher degree of hardness than the first substrate and resistance to an etchant as the stopper layer.

Since in the integrated circuit device manufactured by the manufacturing method of this embodiment mode, a top or a bottom of the layer including an element 404 are covered with the DLC layer, or the left, right, top and bottom sides of the layer including an element 404 are all covered with the DLC layer, the integrated circuit device is superior in a moisture resistance property and a gas barrier property.

Embodiment 1

Figure 25A:
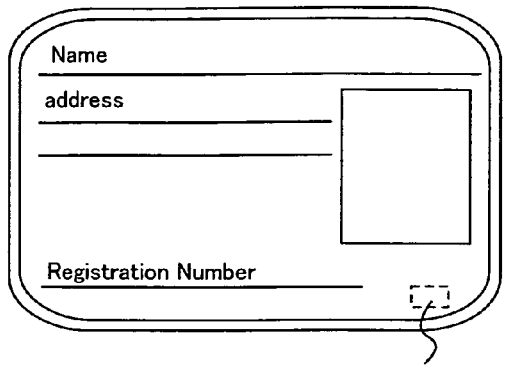
FIGS. 25A to 25E are diagrams describing Embodiment 1.
Figure 25B:
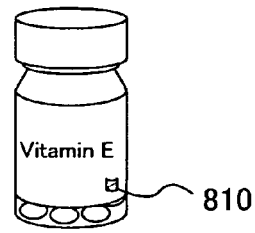
Figure 25C:
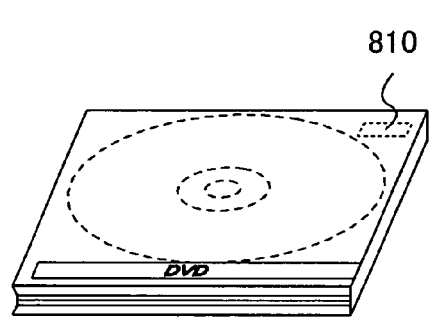
Figure 25D:
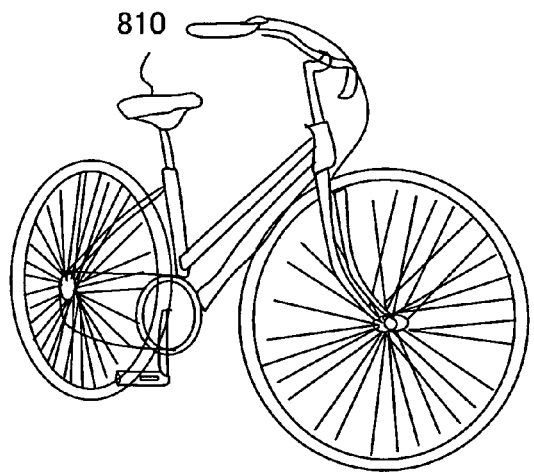
Figure 25E:
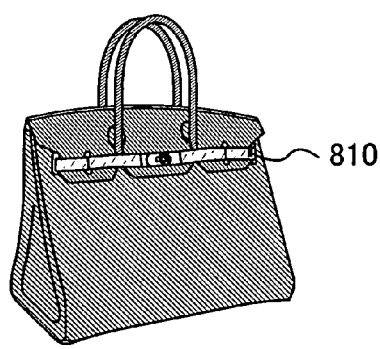

The semiconductor device (RFID) of the present invention described in above embodiment modes can be applied over a wide range and specific examples of these applications are described hereinafter. The semiconductor device 810 of the present invention can be applied to, for example, a banknote, a coin, documents of value, unregistered bonds, identification certificates (driver's license, certificate of residence, and the like, refer to FIG. 25A), pack cases (a pack paper, a bottle, and the like, refer to FIG. 25B), recording media (DVD software, a video tape, and the like, refer to FIG. 25C), vehicles (a bicycle and the like, refer to FIG. 25D), personal belongings (a bag, glasses, and the like (refer to FIG. 25E), foods, clothes, general merchandise, electronic appliances, and the like. The electronic appliances include a liquid crystal display device, an EL display device, a television device (also referred to as simply a TV, a TV receiving machine, or a television receiving machine), a mobile phone, and the like.

The semiconductor device 810 (RFID) of the present invention is fixed to an object by mounting the device onto a print substrate, pasting the device to the surface, or embedding the device inside the object. For example, if the object is a book, the device is fixed to the book by embedding the device inside the paper, and if the object is a package made of an organic resin, the device is fixed to the package by embedding the device inside the organic resin. Since the semiconductor device 810 of the present invention is small, thin, and light-weight, the design quality is not degraded even after the device is fixed to an object. By providing the semiconductor device 810 of the present invention to a banknote, a coin, documents of value, unregistered bonds, identification certificates, and the like, an identification function can be provided, thereby preventing the forgery. Moreover, when the semiconductor device 810 of the present invention is provided in pack cases, recording media, personal belongings, foods, clothes, general merchandise, electronic appliances, and the like, a system such as an inspection system becomes more efficient.

Figure 26A:
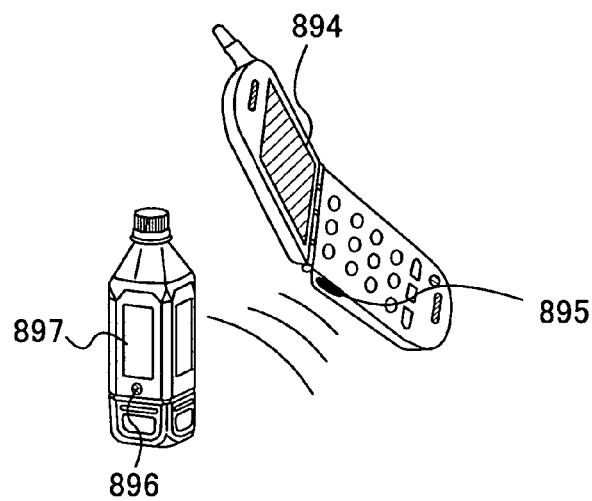
FIGS. 26A and 26B are diagrams describing Embodiment 1.
Figure 26B:
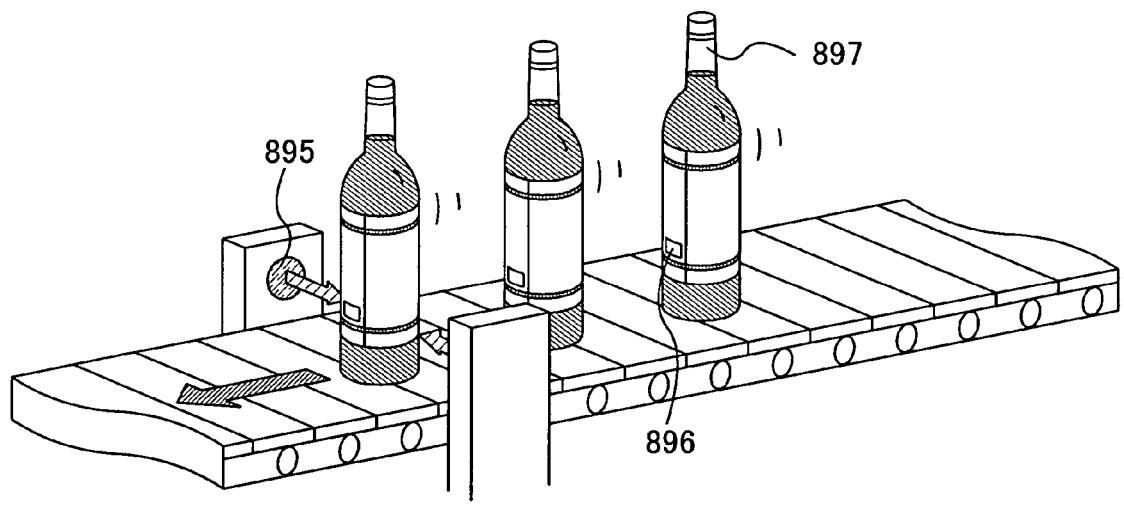

Subsequently, an example of a system using the semiconductor device (RFID) of the present invention is described. First, a reader/writer 895 is provided at a side surface of a mobile terminal including a display portion 894 and the semiconductor device 896 (RFID) of the present invention is provided at a side surface of an object 897 (refer to FIG. 26A). In addition, information of the object 897 such as a material, a production area, or a history of a circulation process is stored in the semiconductor device 896 (RFID) in advance. Then, the information in the semiconductor device 896 (RFID) is displayed in the display portion 894 when the semiconductor device 896 (RFID) is held over the reader/writer 895. Thus, a useful system can be provided. As another example, the reader/writer 895 is provided beside a belt conveyer (refer to FIG. 26B). Then, a system which can inspect the object 897 very easily can be provided. In this way, by using the semiconductor device (RFID) of the present invention for management or a circulation system of objects, the system can become more sophisticated and useful.

This application is which mainly contains Japanese Patent Application serial No. 2005-164605 filed in Japan Patent Office on Jun. 3, 2005, the entire contents of which are hereby incorporated by reference.

What is claimed is:

1. A manufacturing method of an integrated circuit device, comprising the steps of:
    forming a first layer which has higher hardness than a first substrate over one surface of the first substrate;
    forming a buffer layer over the first layer;
    forming an element over the buffer layer;
    bonding a second substrate over the element; and
    grinding or polishing the first substrate from another surface of the first substrate,
    wherein the element includes a thin film transistor, and
    wherein a material used as the first layer is selected from titanium carbonitride or titanium aluminium nitride.

2. The manufacturing method of an integrated circuit device according to claim 1, wherein a thickness of the first substrate is 100 μm or less after grinding or polishing the first substrate.

3. A manufacturing method of an integrated circuit device, comprising the steps of:
    forming a first layer over one surface of a first substrate;
    forming a buffer layer over the first layer;
    forming an element over the buffer layer;
    bonding a second substrate over the element; and
    etching the first substrate from another surface of the first substrate by chemical reaction,
    wherein the first layer is formed with a material which is resistant to an etchant used for etching the first substrate,
    wherein the element includes a thin film transistor, and
    wherein the material used as the first layer is selected from titanium carbonitride or titanium aluminium nitride.

4. The manufacturing method of an integrated circuit device according to claim 3, wherein a thickness of the first substrate is 100 μm or less after etching the first substrate.

5. A manufacturing method of an integrated circuit device, comprising the steps of:
    forming a first layer which mainly contains diamond like carbon over one surface of a first substrate;
    forming a buffer layer over the first layer;
    forming an element over the buffer layer;
    bonding a second substrate over the element; and
    thinning the first substrate from another surface of the first substrate or removing the first substrate,
    wherein the element includes a thin film transistor, and
    wherein the buffer layer is selected from a tungsten carbide film, a boron carbonitride film, a boron nitride film or a diamond like carbon film including titanium.

6. The manufacturing method of an integrated circuit device according to claim 5, wherein the step of thinning the first substrate is performed by grinding or polishing the first substrate.

7. The manufacturing method of an integrated circuit device according to claim 5, wherein the step of thinning the first substrate is performed by etching the first substrate by chemical reaction.

8. The manufacturing method of an integrated circuit device according to claim 5, wherein diamond like carbon film including nitrogen, a boron carbonitride film, or a tungsten carbide film is formed between the first substrate and the first layer.

9. The manufacturing method of an integrated circuit device according to claim 5, wherein a layer which mainly contains diamond like carbon and Si in a range of 1% to 20% is formed between the first substrate and the first layer.

10. The manufacturing method of an integrated circuit device according to claim 5, further comprising the steps of:
    forming a second layer which mainly contains diamond like carbon and Si in a range of 1% to 20% between the first substrate and the first layer;
    forming a layer which mainly contains diamond like carbon and Si in a range of 1% to 20% between the first layer and the element,
    wherein a Si concentration of the second layer is lower than a Si concentration of the layer.

11. The manufacturing method of an integrated circuit device according to claim 5, wherein a thickness of the first substrate is 100 μm or less after thinning the first substrate.

12. A manufacturing method of an integrated circuit device, comprising the steps of:
    forming a first layer which mainly contains diamond like carbon over a first substrate;
    forming a first element over the first layer;
    forming a second layer which mainly contains diamond like carbon over a second substrate;
    forming a second element over the second layer;
    bonding the first substrate with the second substrate so that the first element faces the second element; and
    thinning or removing one or both of the first substrate and the second substrate,
    wherein each of the first element and the second element includes a thin film transistor.

13. The manufacturing method of an integrated circuit device according to claim 12, wherein the first substrate is bonded with the second substrate so that the first element and the second element are electrically connected.

14. The manufacturing method of an integrated circuit device according to claim 12, wherein the first substrate and the second substrate are bonded with an adhesive.

15. The manufacturing method of an integrated circuit device according to claim 12, wherein a thickness of the first substrate is in a range of 10 μm to 100 μm after thinning the first substrate.

16. A manufacturing method of an integrated circuit device, comprising the steps of:
    forming a first layer which mainly contains diamond like carbon over one surface of a first substrate;
    forming a buffer layer over the first layer;
    forming an element over the buffer layer;
    bonding a second substrate over the element using an adhesive; and
    thinning the first substrate from another surface of the first substrate or removing the first substrate,
    wherein the element includes a thin film transistor, and
    wherein the buffer layer is selected from a tungsten carbide film, a boron carbonitride film, a boron nitride film or a diamond like carbon film including titanium.

17. The manufacturing method of an integrated circuit device according to claim 16, wherein a thickness of the first substrate is 100 μm or less after thinning the first substrate.

18. A manufacturing method of an integrated circuit device, comprising the steps of:
    forming a first layer which mainly contains diamond like carbon over a first substrate;
    forming a buffer layer over the first layer;
    forming a first element over the buffer layer;
    forming a second element over a second substrate;
    bonding the first substrate with the second substrate so that the first element faces the second element; and
    thinning or removing one or both of the first substrate and the second substrate,
    wherein each of the first element and the second element includes a thin film transistor, and
    wherein the buffer layer is selected from a tungsten carbide film, a boron carbonitride film, a boron nitride film or a diamond like carbon film including titanium.

19. The manufacturing method of an integrated circuit device according to claim 18, wherein the first substrate is bonded with the second substrate so that the first element and the second element are electrically connected.

20. The manufacturing method of an integrated circuit device according to claim 18, wherein the first substrate and the second substrate are bonded with an adhesive.

21. The manufacturing method of an integrated circuit device according to claim 18, wherein a thickness of the first substrate is 100 μm or less after thinning the first substrate.

22. A manufacturing method of an integrated circuit device, comprising the steps of:
    forming a first layer which mainly contains diamond like carbon over one surface of a first substrate;
    forming a buffer layer over the first layer;
    forming an element over the buffer layer;
    bonding a second substrate over the element; and
    thinning the first substrate from another surface of the first substrate or removing the first substrate,
    wherein the element includes a thin film transistor, and
    wherein the buffer layer mainly contains amorphous carbon.

23. The manufacturing method of an integrated circuit device according to claim 22, wherein the step of thinning the first substrate is performed by grinding or polishing the first substrate.

24. The manufacturing method of an integrated circuit device according to claim 22, wherein the step of thinning the first substrate is performed by etching the first substrate by chemical reaction.

25. The manufacturing method of an integrated circuit device according to claim 22, wherein diamond like carbon film including nitrogen, a boron carbonitride film, or a tungsten carbide film is formed between the first substrate and the first layer.

26. The manufacturing method of an integrated circuit device according to claim 22, wherein a Si concentration of the buffer layer is in a range of 1% to 20%.

27. The manufacturing method of an integrated circuit device according to claim 22, further comprising the steps of:
    forming a second layer which mainly contains diamond like carbon and Si in a range of 1% to 20% between the first substrate and the first layer; and forming a layer which mainly contains diamond like carbon and Si in a range of 1% to 20% between the first layer and the element,
wherein a Si concentration of the second layer is lower than a Si concentration of the layer.

28. The manufacturing method of an integrated circuit device according to claim 22, wherein a thickness of the first substrate is 100 μm or less after thinning the first substrate.

* * * * *